(12) United States Patent
Tsukamura et al.

(10) Patent No.: US 10,844,186 B2
(45) Date of Patent: *Nov. 24, 2020

(54) GAS BARRIER FILM

(71) Applicant: TORAY INDUSTRIES, INC., Tokyo (JP)

(72) Inventors: Yusuke Tsukamura, Otsu (JP); Hiroyuki Uebayashi, Otsu (JP); Minoru Yoshida, Otsu (JP); Motoyuki Suzuki, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 110 days.

This patent is subject to a terminal disclaimer.

(21) Appl. No.: 15/403,799

(22) Filed: Jan. 11, 2017

(65) Prior Publication Data

US 2017/0190858 A1    Jul. 6, 2017

Related U.S. Application Data

(62) Division of application No. 14/354,022, filed as application No. PCT/JP2012/075077 on Sep. 28, 2012, now abandoned.

(30) Foreign Application Priority Data

| Oct. 28, 2011 | (JP) | ................................. 2011-236951 |
| Aug. 8, 2012 | (JP) | ................................. 2012-175608 |
| Sep. 19, 2012 | (JP) | ................................. 2012-205385 |

(51) Int. Cl.
  *C08J 7/04* (2020.01)
  *C08F 259/08* (2006.01)
  (Continued)

(52) U.S. Cl.
  CPC ............ *C08J 7/0423* (2020.01); *B65D 65/40* (2013.01); *C08F 259/08* (2013.01);
  (Continued)

(58) Field of Classification Search
  None
  See application file for complete search history.

(56) References Cited

U.S. PATENT DOCUMENTS 4,927,689 A * 5/1990 Markiewicz ........... B65D 65/42
                                                       428/34.8
6,528,442 B1 * 3/2003 Kuwano .................. C23C 14/08
                                                       204/192.22
(Continued)

FOREIGN PATENT DOCUMENTS

EP     1887100 A1 *  2/2008  ........... C04B 35/453
JP     H 8-142252      6/1996
(Continued)

OTHER PUBLICATIONS

JP 2010-208072 English Machine Translation (Year: 2010).*
(Continued)

*Primary Examiner* — Scott R. Walshon
*Assistant Examiner* — Elaine M Vazquez
(74) *Attorney, Agent, or Firm* — RatnerPrestia

(57) ABSTRACT

A gas barrier film including a polymer base, an undercoat layer that contains, as the main component, an acrylic resin having at least one side chain selected from the group consisting of the side chains (I) to (III) mentioned below, and an inorganic layer, wherein the undercoat layer and the inorganic layer are arranged in this order on at least one surface of the polymer base in such a manner that the undercoat layer and the inorganic layer are in contact with each other: (I) a side chain having an acrylic polymer skeleton; (II) a side chain having a dimethylsiloxane skel-
(Continued)

eton; and (III) a side chain having a skeleton containing a fluorine atom.

7 Claims, 1 Drawing Sheet

(51) Int. Cl.
| | |
|---|---|
| *C08F 290/06* | (2006.01) |
| *C08F 265/06* | (2006.01) |
| *C23C 14/08* | (2006.01) |
| *C23C 14/10* | (2006.01) |
| *B65D 65/40* | (2006.01) |
| *C23C 14/06* | (2006.01) |
| *C23C 14/34* | (2006.01) |
| *C23C 16/40* | (2006.01) |
| *C23C 16/50* | (2006.01) |
| *C08F 220/14* | (2006.01) |
| *C08F 230/08* | (2006.01) |
| *C08L 33/06* | (2006.01) |

(52) U.S. Cl.
CPC ........ *C08F 265/06* (2013.01); *C08F 290/068* (2013.01); *C23C 14/0629* (2013.01); *C23C 14/081* (2013.01); *C23C 14/086* (2013.01); *C23C 14/10* (2013.01); *C23C 14/3457* (2013.01); *C23C 16/40* (2013.01); *C23C 16/50* (2013.01); *C08F 220/14* (2013.01); *C08F 230/08* (2013.01); *C08J 2367/02* (2013.01); *C08J 2433/00* (2013.01); *C08J 2433/10* (2013.01); *C08J 2433/12* (2013.01); *C08J 2433/16* (2013.01); *C08J 2443/04* (2013.01); *C08L 33/066* (2013.01)

(56) References Cited

U.S. PATENT DOCUMENTS

| | | | |
|---|---|---|---|
| 9,090,780 B2 | 7/2015 | Uebayashi et al. | |
| 9,219,018 B2 | 12/2015 | Uebayashi et al. | |
| 2008/0026597 A1 | 1/2008 | Munro et al. | |
| 2012/0031485 A1* | 2/2012 | Hoshi | B32B 27/06 136/256 |
| 2012/0287388 A1* | 11/2012 | Inenaga | B32B 27/00 349/122 |
| 2014/0370260 A1 | 12/2014 | Uebayashi et al. | |

FOREIGN PATENT DOCUMENTS

| | | | |
|---|---|---|---|
| JP | 2002-113826 | 4/2002 | |
| JP | 2006-342250 | 12/2006 | |
| JP | 2008-150539 | 7/2008 | |
| JP | 2009539265 A | 11/2009 | |
| JP | 2011-212857 | 10/2011 | |
| JP | 2011-214134 | 10/2011 | |
| JP | 2011-214136 | 10/2011 | |
| JP | 2013047363 A | 3/2013 | |
| WO | WO-2012114713 A1 * | 8/2012 | ............. C04B 35/16 |

OTHER PUBLICATIONS

JP 2006-342250 English Machine Translation (Year: 2006).*
WO 2012114713 English Machine Translation (Year: 2012).*
Non Final Office Action for U.S. Appl. No. 14/781,158, dated Jul. 10, 2017, 17 pages.
Final Office Action for U.S. Appl. No. 14/781,158, dated Dec. 19, 2017, 7 pages.
Notification of Reasons for Refusal for Japanese Application No. 2014-520421, dated Oct. 17, 2017 with translation, 7 pages.
International Search Report for PCT International Application No. PCT/JP2012/075077 dated Jan. 8, 2013.

* cited by examiner

GAS BARRIER FILM

CROSS REFERENCE TO RELATED APPLICATIONS

This application is a divisional patent application of U.S. patent application Ser. No. 14/354,022, filed on Apr. 24, 2014, which is a U.S. National Phase application of PCT/JP2012/075077, filed Sep. 28, 2012, which claims priority to Japanese Patent Application No. 2011-236951, filed Oct. 28, 2011, Japanese Patent Application No. 2012-175608, filed Aug. 8, 2012, and Japanese Patent Application No. 2012-205385, filed Sep. 19, 2012, the disclosures of each of these applications being incorporated herein by reference in their entireties for all purposes.

FIELD OF THE INVENTION

The present invention relates to gas barrier film to be used as packaging materials for foodstuffs and pharmaceuticals, and members of electronic devices such as solar battery, electronic paper, and organic EL that are required to have high gas barrier properties.

BACKGROUND OF THE INVENTION

Gas barrier films composed of a polymer base having an deposited layer of an inorganic substance (or inorganic oxide) such as aluminum oxide, silicon oxide, and magnesium oxide formed on a surface thereof by a physical vapor deposition (PVD) technique such as vacuum deposition, sputtering, and ion plating, or a chemical vapor deposition (CVD) technique such as plasma chemical vapor deposition, thermochemical vapor deposition, and photochemical vapor deposition have been used as materials for packaging of foodstuffs and pharmaceuticals and members of electronic devices such as Flat-screen TV and solar battery that are required to be impermeable to various gases including water vapor and oxygen.

Gas barrier properties improvement techniques that are available now include, for example, forming a compound composed mainly of silicon oxide and containing at least one element selected from the group consisting of carbon, hydrogen, silicon, and oxygen on a base by the plasma CVD technique using a gas mixture containing vapor of an organic silicon compound and oxygen to achieve improved gas barrier properties while maintaining transparency (Patent document 1). Other gas barrier properties improvement techniques that do not use a film formation process such as plasma CVD include the use of a smooth-surfaced base or a base with an undercoat that provides a smooth surface free from protrusions and irregularities that can cause pinholes and cracks that degrade the gas barrier properties (Patent document 2).

PATENT DOCUMENTS

Patent document 1: Japanese Unexamined Patent Publication (Kokai) No. HEI-8-142252 (Claims)
Patent document 2: Japanese Unexamined Patent Publication (Kokai) No. 2002-113826 (Claims)

SUMMARY OF THE INVENTION

In the case where a layer with gas barrier properties containing silicon oxide as the primary component is formed by the plasma CVD technique, however, the surface of the base is influenced by the heat emitted from the plasma and collisions of ions and radicals and accordingly, the film properties of the resulting gas barrier layer will be largely dependent on the type of base material used, leading to problems such as the fail to ensure stable gas barrier properties.

In the case of forming a gas barrier layer having a smooth-surfaced base or a base with an undercoat that provides a smooth surface, on the other hand, dramatic improvement in performance is not achieved because the resulting gas barrier layer does not have improved film properties although the prevention of the generation of pinholes and cracks serves to improve the reproducibility of gas barrier properties.

In view of such a prior art background, the present invention aims to provide a gas barrier film that achieves dramatically improved gas barrier properties and stable development of such gas barrier properties without using special types of base material.

Embodiments of the present invention adopt the following measures to solve these problems. Specifically, embodiments of the invention provide a polymer base laminated, at least on one surface thereof, with an undercoat layer containing, as the primary component, acrylic resin having at least one side chain selected from the group consisting of (I) to (III) given below and an inorganic layer stacked in contact with each other in this order:
(I) a side chain having an acrylic polymer skeleton,
(II) a side chain having a dimethyl siloxane skeleton,
(III) a side chain having a fluorine atom-containing skeleton.

It is preferable for the aforementioned side chain to contain at least (II) and/or (III) given above.

It is also preferable that the aforementioned acrylic resin be an acrylic resin having a structure produced by copolymerizing an acrylic monomer and at least one macromonomer selected from the group consisting of (i) to (iii) given below:
(i) a macromonomer including an acrylic polymer having a radically polymerizable group at an end thereof,
(ii) a macromonomer including a dimethyl siloxane skeleton-based polymer having a radically polymerizable group at an end thereof,
(iii) a macromonomer including a fluorine atom-containing polymer having a radically polymerizable group at an end thereof.

It is preferable for the aforementioned macromonomer to contain at least (II) or (III) given above.

It is preferable for the undercoat layer to have a surface free energy of 10 to 45 mN/m, more preferably 10 to 25 mN/m.

It is preferable for the acrylic resin to be one produced by copolymerizing 100 parts by mass of the acrylic monomer having a composition as described below with 3 to 8 parts by mass of a macromonomer:
1 to 8 mass % of methacrylic acid,
5 to 16 mass % of 2-hydroxyethyl methacrylate, and
76 to 94 mass % of methyl methacrylate and/or dicyclopentanyl methacrylate.

It is preferable for the inorganic layer to have a thickness of 10 to 1,000 nm and comprise a zinc compound and silicon oxide.

It is preferable for the inorganic layer to be either a layer [B1] or a layer [B2] as described below:
layer [B1]: a layer of a phase in which zinc oxide, silicon dioxide, and aluminum oxide coexist,
layer [B2]: a layer of a phase in which zinc sulfide and silicon dioxide coexist.

In the case where the aforementioned inorganic layer is a layer [B1], it is preferable for the layer [B1] to have a composition with a zinc (Zn) atom concentration of 20 to 40 atom %, silicon (Si) atom concentration of 5 to 20 atom %, aluminum (Al) atom concentration of 0.5 to 5 atom %, and oxygen (O) atom concentration of 35 to 70 atom % as determined by ICP luminescence spectroscopy analysis, while in the case where the inorganic layer is a layer [B2], it is preferable for the layer [B2] to have a composition in which the zinc sulfide accounts for a mole fraction of 0.7 to 0.9 of the total quantity of zinc sulfide and silicon dioxide.

It is preferable for the inorganic layer to have a surface roughness Ra of 2 nm or less.

The production method for gas barrier film according to an embodiment of the present invention includes:
producing, at least on one of the surfaces of a polymer base, an undercoat layer containing, as the primary component, an acrylic resin produced by copolymerizing an acrylic monomer with at least one macromonomer selected from the group consisting of (i) to (iii) given below, and
forming an inorganic layer on the undercoat layer:
(i) a macromonomer including an acrylic polymer having a radically polymerizable group at an end thereof,
(ii) a macromonomer including a dimethyl siloxane skeleton-based polymer having a radically polymerizable group at an end thereof,
(iii) a macromonomer including a fluorine atom-containing polymer having a radically polymerizable group at an end thereof.

The present invention can provide a gas barrier film that achieves dramatic improvement in gas barrier properties and stable development of such gas barrier properties without using special types of base material.

DETAILED DESCRIPTION OF EMBODIMENTS OF THE INVENTION

As a result of intensive studies aimed at obtaining a gas barrier film with good gas barrier properties without using a particular type of polymer base material, the present inventors found that the problems described above can be solved by adopting a polymer base laminated, at least on one of the surfaces thereof, with an undercoat layer containing, as the primary component, an acrylic resin having a skeleton with a specific type of side chain, and an inorganic layer stacked in this order. In particular, it was found that the inorganic layer used for an embodiment of the present invention, which plays the central role in developing gas barrier properties, can serve to dramatically improve the gas barrier properties when it is formed on, and in contact with, a specific type of undercoat layer. An undercoat layer containing an acrylic resin as the primary component as referred to herein contains the acrylic resin at a content of 65 mass % or more, preferably 80 mass % or more, of the undercoat layer. The other components contained in the undercoat layer (hereinafter referred to as the minor components of the undercoat layer) will be described later.

Figure 1:
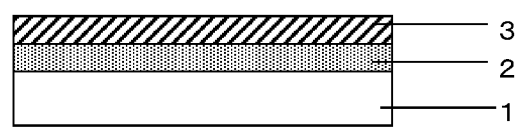
FIG. 1 is a cross-sectional diagram of the gas barrier film according to an embodiment of the present invention.

FIG. 1 is a cross-sectional diagram of the gas barrier film according to an embodiment of the present invention. As illustrated in FIG. 1, the gas barrier film according to an embodiment of the present invention includes a polymer base 1 laminated, on one of the surfaces thereof, with a specific type of undercoat layer 2 and an inorganic layer 3 stacked in this order in such manner that the undercoat layer 2 and the inorganic layer 3 are in contact with each other. Here, FIG. 1 shows an embodiment in which the polymer base 1 is in contact with the undercoat layer 2, but another layer may be disposed between the polymer base 1 and the undercoat layer 2 with the aim of improving the contact in a high temperature, high humidity environment (wet-heat-resistant contact) as long as a flexibility required for the gas barrier film is maintained.

[Polymer Base]

There are no specific limitations on the material to be used for the polymer base according to the present invention as long as it is in the form of a film, but it is preferably a polymer base of an organic polymer because it has flexibility necessary for the production of a gas barrier film. Organic polymers used favorably for the present invention include, for example, polyolefins such as polyethylene and polypropylene; polyesters such as polyethylene terephthalate (PET) and polyethylene naphthalate (PEN); and various other polymers such as polyamide, ABS resin, polycarbonate, polystyrene, polyvinyl alcohol, saponification products of ethylene vinyl acetate copolymers, polyacrylonitrile, and polyacetal. Of these, polyethylene terephthalate is preferably contained. Furthermore, the organic polymer to be used may be either a homopolymer or a copolymer, and either a single organic polymer or a blend of a plurality of organic polymers.

Furthermore, as listed above, the organic polymers that can be used favorably for the present invention have a linear basic skeleton (the term "linear" means that the skeleton does not have a network structure even if it has branching. Hereinafter, an organic polymer having a linear basic skeleton is referred to as linear organic polymer.). In addition, even if partial crosslinking is formed by, for example, adding and reacting a crosslinking agent having two or more functional groups in a molecule or applying radiations, an organic polymer is assumed to be linear if it has a number average molecular weight of 5,000 to 20,000.

The polymer base may be in the form of a monolayer film or a two or more layered film produced by, for example, coextrusion. In regard to film type, it may be a uniaxially or biaxially stretched film. The surface of the polymer base where an undercoat layer and inorganic layer are to be formed may be pre-treated by such techniques as corona treatment, ion bombardment treatment, solvent treatment, and surface roughening treatment in order to ensure good contact with the undercoat layer. The surface of the polymer base opposite to the one where an undercoat layer and inorganic layer are to be formed may be coated with a coat layer of an organic substance, inorganic substance, or a mixture thereof with the aim of improving the slip properties of the film during the winding up step.

There are no specific limitations on the thickness of the polymer base to be used for the present invention, but it is preferably 500 μm or less from the viewpoint of maintaining a required flexibility and preferably 5 μm or more from the viewpoint of maintaining a required resistance to tension and impact. To ensure a required film processability and handleability, furthermore, it is still more preferably 10 μm or more as the lowest limit and 200 μm or less as the highest limit.

[Acrylic Resin]

An acrylic resin to be used according to an embodiment of the present invention contains, as the primary component, an acrylic resin having at least one side chain selected from the group consisting of (I) to (III) given below:
(I) a side chain having an acrylic polymer skeleton,
(II) a side chain having a dimethyl siloxane skeleton,
(III) a side chain having a fluorine atom-containing skeleton.

It is preferable that the acrylic resin to be used for the present invention be an acrylic resin having a structure produced by copolymerizing an acrylic monomer and at least one macromonomer selected from the group consisting of (i) to (iii) given below:
(i) a macromonomer including an acrylic polymer having a radically polymerizable group at an end thereof,
(ii) a macromonomer including a dimethyl siloxane skeleton-based polymer having a radically polymerizable group at an end thereof,
(iii) a macromonomer including a fluorine atom-containing polymer having a radically polymerizable group at an end thereof.

Hereinafter, (i) a macromonomer including an acrylic polymer having a radically polymerizable group at an end thereof, (ii) a macromonomer including a dimethyl siloxane skeleton-based polymer having a radically polymerizable group at an end thereof, and (iii) a macromonomer including a polymer of a structure with a fluorine atom-containing skeleton having a radically polymerizable group at an end thereof are occasionally referred to as macromonomer (A), macromonomer (Si), and macromonomer (F), respectively. In the present Description, furthermore, the simple term of "a macromonomer" refers to at least one macromonomer selected from the group consisting of (i) to (iii) or a mixture of two or more thereof.

The mechanism by which dramatically improved gas barrier properties are achieved by using an acrylic resin having at least one side chain selected from the group consisting of (I) to (III) given above, or preferably an acrylic resin having a structure produced by copolymerizing an acrylic monomer and at least one macromonomer selected from the group consisting of (i) to (iii) given above, has not been clarified, but inferred to be as follows. Specifically, the use of a specific acrylic resin as listed above serves to depress the surface free energy of the undercoat layer at a relatively low level as explained later, and accordingly, the atoms and particles acting as growth nuclei at an initial stage of the growth process for inorganic layer formation can move and diffuse easily in the surface to allow a dense film structure to be formed near the undercoat layer. From this point of view, because of the effect of depressing the surface free energy of the undercoat layer at a low level, it is preferable for the side chains to contain at least (II) and/or (III) and it is preferable for the macromonomers to be acrylic resins having a structure containing at least (ii) or (iii). Because of easy fine control of the denseness of the inorganic layer, it is more preferable that the side chains contain (a) (I) and (b) (II) and/or (III) and it is particularly preferable that the macromonomers are acrylic resins having a structure containing (a) (i) and (b) (ii) or (iii).

Furthermore, it is preferable that an acrylic resin to be used for the present invention have a structure produced by copolymerizing (1) 1 to 8 mass % of a methacrylic acid, (2) 5 to 16 mass % of 2-hydroxyethyl methacrylate, and (3) 76 to 94 mass % of methyl methacrylate and/or dicyclopentanyl methacrylate, which altogether constitute 100 mass % of the acrylic monomers involved, and macromonomers that account for 3 to 8 parts by mass relative to the 100 parts by mass of the acrylic monomers. Here, products such as Fancryl FA-513M (manufactured by Hitachi Chemical Co., Ltd.) can be used as the dicyclopentanyl methacrylate.

If the (1) methacrylic acid accounts only for less than 1 mass % of the acrylic monomers used for the copolymerization of the acrylic resin, the resulting acrylic resin occasionally fails to have a sufficient cohesion force, leading to inadequate adhesion with the polymer base, while if the (1) methacrylic acid accounts for more than 8 mass %, the acrylic resin occasionally fails to have sufficient chemical resistance such as water resistance and alkaline resistance. From this point of view, it is preferable for the (1) methacrylic acid to account for 1 to 7 mass %, more preferably 1 to 5 mass %.

If the (2) 2-hydroxyethyl methacrylate accounts only for less than 5 mass % of the acrylic monomers used for the copolymerization of the acrylic resin, the resulting acrylic resin occasionally fails to achieve a sufficient adhesion with a polymer base material such as PET, PEN, polyamide, and ABS resin, while the (2) 2-hydroxyethyl methacrylate accounts for more than 16 mass %, the acrylic resin, for example, occasionally fails to produce a coating liquid with a sufficiently long pot life when blended with a crosslinking agent, leading to insufficient coating workability. From this point of view, it is preferable for the (2) 2-hydroxyethyl methacrylate to account for 5 to 12 mass %, more preferably 8 to 12 mass %.

If the (3) methyl methacrylate and/or dicyclopentanyl methacrylate account for only less than 76 mass % of the acrylic monomers used for the copolymerization of the acrylic resin, they occasionally fail to have a high compatibility with the macromonomers, leading to poor contact with the polymer base. If the (3) methyl methacrylate and/or dicyclopentanyl methacrylate account for more than 94 mass %, they occasionally fail to have a moderate incompatibility with the macromonomers, leading to the loss of the function to further reduce the surface roughness of the undercoated. From this point of view, it is preferable for the (3) methyl methacrylate and/or dicyclopentanyl methacrylate to account for 76 to 94 mass %, more preferably 81 to 94 mass %, and still more preferably 83 to 91 mass %.

In the acrylic resin, the compatibility of the skeleton chain and side chain in the molecule changes depending on the compounding ratio of the skeleton chain originating from the acrylic monomer and the side chain originating from the macromonomers and also on the ratio of the side chains originating from the macromonomers (ratio between (a) side chains having an acrylic polymer skeleton and (b) side chains having a dimethyl siloxane skeleton and/or side chains having a fluorine atom-containing skeleton). The compatibility of the skeleton chain and side chain in the molecule can be controlled, and accordingly characteristics such as free energy of the entire molecule can be varied, by changing the type and compounding ratio of the acrylic monomer or changing the type and compounding ratio of the macromonomers. It is known that such variations in characteristics of the macromonomers can influence the changes in the microscopic layer separation structures (such as lamella, gyroid, cylinder, and BCC).

It is preferable that an acrylic resin to be used for the present invention have a structure produced by copolymerizing 100 parts by mass of the acrylic monomer with 3 to 8 parts by mass of macromonomers. If the proportion of the macromonomers used as material for the acrylic resin (hereinafter, occasionally referred to as the proportion of the macromonomers in the acrylic resin) is less than 3 parts by mass, the formation of an undercoat layer possibly cannot serve effectively for reducing the irregularities in the surface of the polymer base, leading to an undercoat layer with insufficient surface smoothness. If the proportion of the macromonomers in the acrylic resin is more than 8 parts by mass, the compatibility between the main structure of the acrylic resin having a structure produced by copolymerizing methacrylic acid/2-hydroxyethyl methacrylate/methyl methacrylate and/or dicyclopentanyl methacrylate and the side chains originating from the macromonomers tends to be low and the undercoat layer formed from the acrylic resin possibly suffers from inadequate adhesion with the polymer base and poor transparency. From this point of view, the proportion of the macromonomers in the acrylic resin is preferably 3 to 8 parts by mass, more preferably 3 to 7 parts by mass, still more preferably 3 to 5 parts by mass. If the proportion of the macromonomers in the acrylic resin used for the present invention is 3 to 8 parts by mass, it is preferable because the resulting undercoat layer will achieve a good balance among the adhesion with the polymer base, transparency, and smoothness and show high performance.

The number average molecular weight of the macromonomers to be used for the present invention is preferably 2,000 to 50,000, more preferably 3,000 to 30,000, and still more preferably 5,000 to 10,000. If the number average molecular weight of the macromonomers is less than 2,000, the side chains will be relatively short compared to the main structures originating from the acrylic monomer composed of methacrylic acid/2-hydroxyethyl methacrylate/methyl methacrylate and/or dicyclopentanyl methacrylate, and accordingly, they will be trapped by the main structures, possibly making it difficult to decrease the surface free energy of the coat film. If the number average molecular weight of the macromonomers is more than 50,000, on the other hand, a rise in viscosity can take place during polymerization, possibly leading to a decrease in the monomer-to-polymer conversion percentage.

In regard to the macromonomers to be used for the present invention, it is preferable to adopt at least one macromonomer selected from the group consisting of (i) to (iii) given below.
(i) Macromonomer including an acrylic polymer having a radically polymerizable group at an end thereof: macromonomer (A)
(ii) Macromonomer including a dimethyl siloxane skeleton-based polymer having a radically polymerizable group at an end thereof: macromonomer (Si)
(iii) Macromonomer including a fluorine atom-containing polymer having a radically polymerizable group at an end thereof: macromonomer (F)

The macromonomer (A) to be used for the present invention is preferably a polymethyl methacrylate macromonomer which is composed of a polymethyl methacrylate having a methacryloyl group at an end. If a polymethyl methacrylate macromonomer is used, there will be a high compatibility between the skeleton chains originating from the acrylic monomer and the side chains originating from the macromonomer (A), leading to strong adhesion between the undercoat layer and the polymer base and an improved transparency of the undercoat layer. Commercial products of polymethyl methacrylate macromonomers include Macromonomer AA-6 and Macromonomer 45% AA-6 (both manufactured by Toagosei Co., Ltd.).

The macromonomer (Si) to be used for the present invention is preferably a polydimethyl siloxane macromonomer that includes a dimethyl siloxane skeleton-based polymer having a radically polymerizable group at an end thereof. The use of a polydimethyl siloxane macromonomer is preferable because it will be easy to control the surface free energy at a low level as described later. Commercial products of polydimethyl siloxane macromonomers include, for example, AK-5, AK-30, and AK-32 (manufactured by Toagosei Co., Ltd.) and X-22-174DK, X-24-8201, and X-22-2426 (manufactured by Shin-Etsu Chemical Co., Ltd.). The macromonomer (Si) to be used may be one of these commercial products or may be polymerized by, for example, an appropriate method found in literature (such as Japanese Unexamined Patent Publication (Kokai) No. 2009-197042).

The macromonomer (F) to be used for the present invention is preferably one that includes a fluorine atom-containing polymer having a radically polymerizable group at an end thereof. Such a macromonomer (Si) may be a commercial product or may be newly polymerized by, for example, an appropriate method found in literature (such as Japanese Unexamined Patent Publication (Kokai) No. HEI-10-120738). Useful precursors serving to polymerize a macromonomer (F) include (meth)acrylates such as 2,2,2-trifluoroethyl acrylate, 2,2,2-trifluoroethyl methacrylate, 2,2,3,3-tetrafluoropropyl acrylate, 1H,1H,5H-octafluoropentyl acrylate, and 1H,1H,5H-octafluoropentyl acrylate; and fluoroolefins such as tetrafluoroethylene, chlorotrifluoroethylene, trifluoroethylene, vinylidene fluoride, vinyl fluoride, and hexafluoropropylene. These may be used singly or appropriate ones of each group may be mixed at an appropriate ratio.

For the present invention, it is preferable to use acrylic monomers and macromonomers that contain only those radically polymerizable groups which have a methacryloyl group ($CH_2=C(CH_3)-C(=O)O-$). If the acrylic monomers and macromonomers used are ones containing only those radically polymerizable groups which have a methacryloyl group, it is preferable because the resulting acrylic resin will have a further increased cohesion force and accordingly will achieve an improved adhesion with the polymer base, leading to improvement in solvent resistance and heat resistance.

Furthermore, the contribution of the surface free energy of the undercoat layer to the effect of achieving dramatically improved gas barrier properties according to an embodiment of the present invention is inferred to arise as follows: if a surface free energy is controlled at less than 45 mN/m, the atoms and particles that act as nuclei for film growth will be able to move and diffuse easily in the surface during the initial growth step in the inorganic layer formation process, and accordingly, dense film properties will be developed near the undercoat layer, resulting in the formation of an entirely dense layer that can control the penetration of gases. From such a point of view, the surface free energy of the undercoat layer is more preferably 30 mN/m or les, still more preferably 25 mN/m or less. It is also preferable for the surface free energy to be 10 mN/m or more. If the surface free energy is less than 10 mN/m, the contact between the undercoat layer and the inorganic layer will possibly be weak, failing to form a dense structure in the inorganic layer. From these considerations, the surface free energy of the undercoat layer is preferably 10 to 45 mN/m, more preferably 10 to 30 mN/m, and still more preferably 10 to 25 mN/m.

For adjusting the surface free energy of the undercoat layer used according to an embodiment of the present invention, the available methods include controlling the surface free energy of the acrylic monomer, a macromonomer, or a minor component of the undercoat layer, of which the method of selecting an optimum compounding ratio, type, or combination of the macromonomers is preferable because of a high degree of freedom for adjusting them without having a significant influence on other characteristics. (a) Macromonomer (A) has a relatively large surface free energy and, for example, the use of 3 to 8 parts by mass of it per 100 parts by mass of the acrylic monomer will permit adjustment in the range of about 30 to 45 mN/m. (b) Macromonomer (Si) and/or macromonomer (F) has a relatively small surface free energy and, for example, the use of 3 to 8 parts by mass of it per 100 parts by mass of the acrylic monomer will permit adjustment in the range of about 10 to 25 mN/m. These facts suggest that if (a) macromonomer (A) and (b) macromonomer (Si) and/or macromonomer (F) are used, the surface free energy can be controlled by adjusting their content ratio. There are no specific limitations on the compounding ratio of the macromonomers, but in order to adjust the surface free energy in a moderate range, the content of (a) macromonomer (A) is preferably 10 to 70 mass %, more preferably 20 to 50 mass %, relative to the total quantity of the macromonomers.

For the present invention, the term "(b) macromonomer (Si) and/or macromonomer (F)" means the single use of either a macromonomer (Si) or a macromonomer (F) or the use of their mixture combined at an appropriate mixing ratio.

In addition, another macromonomer different from the above ones may also be contained. It may also be effective to use a mixture of two or more macromonomers that have different molecular weight distributions.

To examine the surface free energy of the undercoat layer according to an embodiment of the present invention, four measuring liquids (water, formamide, ethylene glycol, and methylene iodide) with known component forces (dispersion force, polar force, and hydrogen bonding force) are prepared and the contact angle of each measuring liquid is determined, followed by calculating the components using the following formula that is derived from the extended Fowkes' equation and Young's equation.

[Formula 1]

$$(\gamma Sd \cdot \gamma Ld)^{0.5} + (\gamma Sp \cdot \gamma Lp)^{0.5} + (\gamma Sh \cdot \gamma Lh)^{0.5} = \gamma L(1 + \cos \theta)/2 \qquad (1)$$

where $\gamma S = \gamma Sd + \gamma Sp + \gamma Sh$
$\gamma L = \gamma Ld + \gamma Lp + \gamma Lh$
$\gamma S$: surface energy of undercoat layer
$\gamma Sd$: dispersion force component of undercoat layer
$\gamma Sp$: polar force component of undercoat layer
$\gamma Sh$: hydrogen bonding force component of undercoat layer
$\gamma L$: surface energy of measuring liquid
$\gamma Ld$: dispersion force component
$\gamma Lp$: polar force component
$\gamma Lh$: hydrogen bonding force component
$\theta$: contact angle of measuring liquid on undercoat layer

[Characteristics of Acrylic Resin]

The acrylic resin used for the present invention preferably has a glass transition temperature (hereinafter also referred to as Tg) of 50 to 180° C. If the acrylic resin used for the present invention has a Tg of less than 50° C., the acrylic resin will possibly be low in cohesion force and unable to achieve a sufficient adhesion with the inorganic layer. If the acrylic resin has a Tg of more than 180° C., the acrylic resin is possibly brittle and unable to deform in coordination with processing such as bending and molding of the polymer base. From this point of view, the acrylic resin preferably has a Tg of 55 to 175° C., more preferably 60 to 170° C., and still more preferably 80 to 160° C. If the acrylic resin used for the present invention has a Tg of 55 to 175° C., it is preferable because the resin tends to have well-balanced characteristics including adhesion with polymer base materials such as PET film, PEN film, nylon, and ABS resin, as well as flexibility and chemical resistance and show high performance, and a Tg of 80 to 160° C. is more preferable because the resulting undercoat layer will have a high surface denseness due to high smoothness and cohesiveness at the surface of the undercoat layer, allowing the inorganic layer formed thereon to have further improved uniformity and surface smoothness.

The number average molecular weight of the acrylic resin to be used for the present invention is preferably 5,000 to 30,000, more preferably 8,000 to 28,000, and still more preferably 8,000 to 25,000. If the number average molecular weight of the acrylic resin to be used for the present invention is 5,000 to 30,000, it is preferable because a moderate leveling property is maintained to minimize the surface roughness of the undercoat layer.

[Production Method for Acrylic Resin]

It is preferable that the acrylic resin to be used for the present invention be one produced by copolymerizing an acrylic monomer and at least one macromonomer selected from the group consisting of (i) to (iii) given below:

(i) a macromonomer including an acrylic polymer having a radically polymerizable group at an end thereof,
(ii) a macromonomer including a dimethyl siloxane skeleton-based polymer having a radically polymerizable group at an end thereof,
(iii) a macromonomer including a fluorine atom-containing polymer having a radically polymerizable group at an end thereof.

In this copolymerization step, it is desirable that the acrylic resin be produced by solution polymerization using an organic peroxide such as benzoyl peroxide, an azo polymerization initiator such as azobisisobutyronitrile and 2,2'-azobis(2,4-dimethylvaleronitrile), and a chain transfer agent such as n-dodecyl mercaptan and t-dodecyl mercaptan, in an organic solvent such as ethyl acetate, butyl acetate, toluene, and xylene at a polymerization temperature of 50 to 120° C. To describe this solution polymerization in detail, a preferable method is feeding the macromonomer and the organic solvent in a polymerization container, heating them at an appropriate polymerization temperature, and adding a mixture of the acrylic monomer, polymerization initiator, and chain transfer agent. Thus, it is considered that the feeding of a macromonomer in an organic solvent and the subsequent addition of an acrylic monomer, polymerization initiator, and chain transfer agent ensure efficient copolymerization between the macromonomer and the acrylic monomer, which is preferable because it leads to further improvement in the adhesion with the polymer base and the smoothness of the surface of the undercoat layer.

The polymerization reaction for preparing the acrylic resin to be used for the present invention is preferably carried out in an inert gas atmosphere such as nitrogen gas, and it is preferable to fill the polymerization container with an inert gas before feeding the monomers to the polymerization container and then add the acrylic monomer and macromonomer s (and an organic solvent if necessary) while continuing to supply the inert gas. By carrying out the polymerization reaction in an inert gas atmosphere, the radicals formed from the acrylic monomer and macromonomers during the reaction process are prevented from reacting with active gases (such as oxygen gas).

A production method for the acrylic resin used according to an embodiment of the present invention is described concretely below. An organic solvent (such as toluene and ethyl acetate) and the polymethyl methacrylate macromonomer are fed to a polymerization apparatus equipped with a stirrer, nitrogen gas supply nozzle, capacitor, and monomer dropping device while supplying nitrogen gas, followed by heating to a predetermined polymerization temperature. Then, the acrylic monomer, polymerization initiator (such as azobisisobutyronitrile and tertiary butylperoxy-2-ethyl hexanoate), chain transfer agent (such as n-dodecyl mercaptan and t-dodecyl mercaptan), which are weighed and mixed in advance to prepare a uniform mixture solution, are dropped to a polymerization container at a predetermined rate. After the completion of the dropping, an additional amount of the polymerization initiator is added to increase the monomer-to-polymer conversion percentage, and the solution is continued to be heated and stirred for a predetermined period, and then cooled.

According to an embodiment of the present invention, an undercoat layer containing, as the primary component, an acrylic resin as produced above is formed at least on one surface of a polymer base, and it is also preferable here for the undercoat layer to contain minor components as specified below.

[Minor Components of Undercoat Layer]

The undercoat layer used for the present invention preferably contains a crosslinking agent, modifier polymer, or other substances as minor components. Preferred crosslinking agents to be used as minor components of the undercoat layer include polyisocyanate compounds such as tolylene diisocyanate, hexamethylene diisocyanate, meta-xylene diisocyanate, and isophorone diisocyanate that react with the acrylic resin to form a required crosslinked structure. Preferred modifier polymers to be used as minor components of the undercoat layer include polyester diols and polyurethane diols that are compatible with the acrylic resin. When these minor components for the undercoat layer are added to the acrylic resin which is the primary component of the undercoat layer, it is preferable that these minor components be added to the acrylic resin solution resulting from the aforementioned solution polymerization. It is also preferable that the viscosity is decreased by lowering the solid content and the coating workability is improved by adding an organic solvent during the addition of these minor components, or before or after the addition of these minor components, in preparing an acrylic resin coating liquid. Useful organic solvents for this purpose include alcohols such as ethyl alcohol, isopropyl alcohol, ethanol, isopropanol, n-propanol, and butyl alcohol; esters such as ethyl acetate, butyl acetate, and triethyl orthoacetate; ketones such as cyclohexanone, methyl ethyl ketone, and methyl isobutyl ketone; alkylene glycol ethers such as propylene glycol monopropyl ether, propylene glycol monobutyl ether, ethylene glycol monoethyl ether, and ethylene glycol monobutyl ether; and aromatic substances such as toluene and xylene.

Using a polyisocyanate compound such as hexamethylene diisocyanate as a minor component that acts as a crosslinking agent for the undercoat layer used for the present invention is preferable because the undercoat layer will have an improved toughness and achieve a strong adhesion with the plane that defines the undercoat layer (the surface of the polymer base or the surface of the additional layer disposed between the undercoat layer and the polymer base in the case where such an additional layer exists) of PET, PEN, polyamide, ABS resin, etc.

Using a modifier polymer such as polyester diol as a minor component for the undercoat layer used for the present invention is preferable because the resulting undercoat layer will have increased and improved hardness, flaw resistance, toughness, flexibility, and other mechanical properties and achieve an improved adhesion with the polymer base of PET, PEN, polyamide, ABS resin, etc., and also because the undercoat layer will have further improved surface smoothness. Commercial polymer products that can serve as such modifiers include Flexorez 148, Flexorez 188, Flexorez XP-171-90, and Flexorez UD-320 (all manufactured by King Industries, Inc.).

Of the modifier polymers such as polyester polyols and polyester diols to be contained in the undercoat layer used for the present invention, polyester diols are preferable. This is because it serves to ensure further improvement in the adhesion between the undercoat layer and the plane that defines the undercoat layer (the surface of the polymer base or the surface of the additional layer disposed between the undercoat layer and the polymer base in the case where such an additional layer exists) and in the smoothness of the surface (the plane defining the inorganic layer) of the resulting undercoat layer. The use of polyester polyol is preferable also because the acrylic resin coating liquid will have improved storage stability.

In the present Description, the term "acrylic resin coating liquid" refers to a mixture of an acrylic resin that acts as the primary component of the undercoat layer, minor components for the undercoat layer such as crosslinking agents and modifier polymers, and an appropriate organic solvent. Furthermore, the primary component and minor components for the undercoat layer contained in the acrylic resin coating liquid are collectively referred to undercoat layer formation components.

In the acrylic resin coating liquid used for the present invention, the polyester polyol preferably accounts for 5 to 35 mass % of the total quantity of the undercoat layer formation components. If the content of the polyester polyol is 5 to 35 mass %, the acrylic resin coating liquid will have high storage stability, and the mixture produced by adding a polyisocyanate compound such as isophorone diisocyanate, xylene diisocyanate, and hexamethylene diisocyanate will have a long pot life, leading to improved workability. Furthermore, the undercoat layer will have improved flexibility, impact resistance, and flaw resistance (hardness). If the content of the polyester polyol is less than 5 mass %, the resulting undercoat layer will possibly be brittle with inadequate flexibility and impact resistance while if the content of the polyester polyol is more than 35 mass %, the adhesion with the plane that defines the undercoat layer (the surface of the polymer base or the surface of the additional layer disposed between the undercoat layer and the polymer base in the case where such an additional layer exists) will possibly be weak.

If a polyester polyol is added to the acrylic resin coating liquid used for the present invention, it is preferable for the polyester polyol to have a hydroxyl equivalent of 200 to 500, more preferably 220 to 500, and still more preferably 230 to 480. If the polyester polyol has a hydroxyl equivalent of 200 to 500 in such a case, it is preferable because, for example, the mixture produced by adding a polyisocyanate compound such as isophorone diisocyanate, xylene diisocyanate, and hexamethylene diisocyanate in order to form urethane crosslinks in the acrylic resin will have a long pot life. Furthermore, the undercoat layer will have improved bending properties, flexibility, and hardness, and the undercoat layer will also have minimized surface roughness.

In addition to the undercoat layer formation components and organic solvent, the acrylic resin coating liquid used for the present invention may also contain a stabilizer such as antioxidant, photostabilizer, and ultraviolet absorber; a paint additive such as antifoam agent, leveling agent, and wetting agent; silane coupling agent such as γ-glycidoxy propyl trimethoxysilane and 3-aminopropyl triethoxysilane; methacrylic acid or metal salt of acrylic acid such as zinc methacrylate; and other materials generally used in paints.

In addition, with the aim of reducing the surface free energy of the undercoat layer, a silicone-based surface active agent or silicone resin, i.e., a compound containing a silicon (Si) atom, may be added unless they work to decrease the contact of the undercoat layer with the inorganic layer or its gas barrier properties. Compounds that serve for this purpose include amino modified silicone, epoxy modified silicone, carboxyl modified silicone, carbinol modified silicone, alkoxy modified silicone, polyether modified silicone, alkyl modified silicone, fluorine modified silicone, polyether modified polydimethyl siloxane, polyester modified polydimethyl siloxane, aralkyl modified polymethyl alkyl siloxane, polyether modified siloxane, polyether modified acrylate-containing polydimethyl siloxane, silicone modified polyacrylic, isocyanate-containing polysiloxane, vinyl silane, methacryl silane, epoxy silane, mercaptosilane, aminosilane, ureidosilane, and isocyanate silane. In addition, fluorine (F) atom-containing compounds such as perfluoroalkyl can also be used for the same purpose.

[Organic Solvents Used for Coating Liquid]

Organic solvents that can be used to prepare the acrylic resin coating liquid used for embodiments of the present invention include hydrocarbons such as petroleum naphtha, methyl cyclohexane, toluene, xylene, and turpentine; alcohols such as methanol, ethanol, n-propanol, isopropanol, n-butanol, isobutanol, secondary butanol, and tertiary butanol; ethers such as isopropyl ether, n-butyl ether, and di-isoamyl ether; ketones such as acetal, acetone, methyl acetone, methyl ethyl ketone, methyl-n-propyl ketone, methyl-n-butyl ketone, methyl isobutyl ketone, methyl-n-amyl ketone, and cyclohexanone; and esters such as methyl acetate, ethyl acetate, n-propyl acetate, isopropyl acetate, n-butyl acetate, isobutyl acetate, and n-amyl acetate; and polyhydric alcohols and derivatives thereof such as ethylene glycol, ethylene glycol monomethyl ether, ethylene glycol monomethyl ether acetate, ethylene glycol monoethyl ether, ethylene glycol monoethyl ether acetate, propylene glycol monomethyl ether, propylene glycol monoethyl ether, and propylene glycol methyl ether acetate. For preparing the acrylic resin to be used according to an embodiment of the present invention, the organic solvents described above may be used singly or two or more thereof may be used as a mixture.

The acrylic resin coating liquid used for the present invention preferably contains at least one organic solvent selected from the group consisting of ester-based organic solvents and ketone-based organic solvents.

In regard to the organic solvent to be adopted to prepare the acrylic resin coating liquid used for the present invention, the use of at least one organic solvent selected from the group consisting of ester-based organic solvents and ketone-based organic solvents is preferable because the acrylic resin will have high coating workability due to increased storage stability and drying property as well as decreased viscosity. The organic solvent to be adopted to prepare the acrylic resin coating liquid used for the present invention is preferably a ketone-based organic solvent, particularly preferably methyl ethyl ketone or methyl isobutyl ketone, because the resulting undercoat layer will have minimized surface roughness.

[Coating with Acrylic Resin Coating Liquid]

Useful coating techniques for the acrylic resin coating liquid that is applied to form an undercoat layer used for the present invention include, for example, generally known coating techniques such as bar coating, reverse coating, gravure coating, rod coating, die coating, spray coating, and coil coating, as well as electrostatic coating and electric force-based coating. For the present invention, gravure coating is preferred for use as the coating technique.

The undercoat layer used for the present invention preferably has a thickness of 0.2 μm or more and 10 μm or less. If the layer has a thickness of less than 0.2 μm, the inorganic layer will possibly have uneven film properties, and accordingly degraded gas barrier properties, as a result of the influence of surface irregularities in the polymer base. If the layer has a thickness of more than 10 μm, the undercoat layer will possibly suffer from a large residual stress in the layer that can cause warping of the polymer base and cracking in the inorganic layer, leading to degraded gas barrier properties. Thus, the thickness of the undercoat layer is preferably 0.2 μm or more and 10 μm or less, and from the viewpoint of maintaining high flexibility, it is preferably 0.5 μm or more and 5 μm or less. The thickness of an undercoat layer can be determined from cross-sectional images observed by transmission electron microscopy (TEM).

After coating a polymer base with the acrylic resin coating liquid, it is preferable to treat it in a drier to remove the organic solvent by volatilization. If the drying temperature is low, the organic solvent will possibly remain in the undercoat layer to make the undercoat layer brittle while if the drying temperature is high, the polymer film will suffer from thermal deformation to cause an increase in the surface roughness in the undercoat layer. Accordingly, the drying temperature is preferably 80 to 150° C., more preferably 100 to 130° C.

If the treatment period for volatilization of the organic solvent after coating the polymer base with the acrylic resin coating liquid is short, the coated surface of the acrylic resin coating liquid will not possibly be leveled sufficiently, causing an increase in surface roughness in the undercoat layer. If the treatment period for volatilization of the organic solvent is long, on the other hand, the polymer film will suffer from thermal deformation to cause an increase in surface roughness in the undercoat layer. Accordingly, the drying period is preferably 0.1 to 3 minutes, preferably 0.2 to 2 minutes.

If an undercoat layer formation component containing a crosslinking agent is used, the volatilization of the organic solvent is preferably followed by curing it in a constant temperature bath to promote the crosslinking reaction between the acrylic resin and the crosslinking agent. The temperature for the acceleration of crosslinking reaction is preferably 30 to 60° C., more preferably 40 to 50° C. The curing is preferably continued for 0.5 day or more to improve the degree of the crosslinking reaction, but the effect for increasing the crosslinking reaction will level off and the polymer film will suffer from thermal deformation as the period is lengthened and therefore, it is preferably 7 days or shorter. In view of the productivity as well, the curing period is more preferably 1 to 3 days.

The undercoat layer used for the present invention preferably has a smooth surface. To allow the gas barrier film to function effectively, the surface of the undercoat layer is required not to have significant quantities of particles, such as foreign objects, and protrusions. Therefore, the coating of the polymer base with the acrylic resin is preferably performed in a clean room. The degree of cleanness is preferably class 10000 or lower, more preferably class 1000 or lower.

[Inorganic Layer]

Next, the inorganic layer is described in detail below. According to an embodiment of the present invention, the inorganic layer functions as the main layer in developing gas barrier properties. It is preferable that the material to be used for inorganic layer of the present invention be able to from a dense amorphous film and contain silicon dioxide, which serves to develop gas barrier properties.

The inorganic layer to be used for an embodiment of the present invention preferably has a thickness of 10 nm or more. If the inorganic layer has a thickness of less than 10 nm, a sufficiently high degree of gas barrier properties may not be maintained at some positions, leading to problems such as uneven gas barrier properties. From this point of view, the inorganic layer more preferably has a thickness of 100 nm or more. If the thickness of the inorganic layer is more than 1,000 nm, a large residual stress will take place in the layer, and cracks will be generated easily in the inorganic layer under bending and external impact, possibly leading to deterioration in the gas barrier properties in the course of long-term use. Therefore, the inorganic layer preferably has a thickness of 1,000 nm or less, and from the viewpoint of maintaining required flexibility, its thickness is preferably 500 nm or less. The thickness of the inorganic layer can be determined from cross-sectional observations by transmission electron microscopy (TEM).

The inorganic layer to be used for the present invention preferably has a surface roughness Ra of 2 nm or less. According to an embodiment of the present invention, the inorganic layer plays the main role in developing gas barrier properties, and the gas barrier properties are developed as a result of the inorganic layer having dense film properties. To form an inorganic layer with a higher degree of denseness, the inorganic layer should have a dense surface structure. Thus, the inorganic layer has an increased surface smoothness and a decreased surface roughness Ra.

As a result of investigations by the inventors, it was found that the formation of an inorganic layer that covers the undercoat layer of an embodiment of the present invention serves to develop dramatically improved gas barrier properties.

Any useful material adopted for the inorganic layer of the present invention preferably has a composition containing a zinc compound and a silicon compound, and more preferably has a composition containing a zinc compound and a silicon oxide because they can form an amorphous film with dense properties and serve to develop high gas barrier properties. The silicon oxide used here is preferably a silicon dioxide. Hereinafter, silicon dioxide may be abbreviated as $SiO_2$. In regard to silicon dioxide ($SiO_2$), a substance having a composition ratio slightly differing from that based on the silicon-oxygen ratio in the above composition formula (between SiO and $SiO_2$) may result depending on the production conditions adopted, but such a substance is herein referred to as silicon dioxide or $SiO_2$.

According to an embodiment of the present invention, the mechanism by which the advantageous effect of an embodiment of the invention is achieved as a result of forming an inorganic layer on, and in contact with, the aforementioned undercoat layer is considered to be as follows. Specifically, as compared with a structure in which a layer of silicon dioxide is formed directly on the polymer base, the formation of an inorganic layer on the undercoat layer serves effectively to prevent the polymer base from being damaged by ions and radicals of the plasma used to produce the silicon dioxide layer, allowing a dense silicon dioxide layer to be produced stably. It is expected, furthermore, that if the surface free energy of the undercoat layer is maintained in the range of 45 mN/m or less, the sputtering particles will be able to diffuse easily in the surface of the silicon dioxide layer on the polymer base surface and finer dense film properties will be developed near the polymer base surface as compared with conventional cases, leading to improved gas barrier properties.

The inorganic layer to be used for the present invention may additionally contain an oxide, nitride, or sulfide of Zn, Al, Ti, Zr, Sn, In, Nb, Mo, or Ta, or, a mixture thereof, as long as it contains silicon oxide.

As a result of investigations by the preferably inventors, it was found that high gas barrier properties can be achieved by using [B1] a layer of a phase in which zinc oxide, silicon dioxide, and aluminum oxide coexist (hereinafter abbreviated as layer [B1]) or [B2] a layer of a phase in which zinc sulfide and silicon dioxide coexist (hereinafter abbreviated as layer [B2]) as the inorganic layer. (Details of layer [B1] and layer [B2] will be described later.)

Furthermore, in order to improve the abrasion resistance, an additional layer such as hard coat layer may be formed on the inorganic layer used for the present invention unless it causes deterioration in the gas barrier properties. Alternatively, the gas barrier film according to the present invention may be combined with a functional member formed of a material such as other resin film, paper base material, metallic material, synthetic paper, and cellophane to provide various layered laminate products. Such a laminate can be a multifunctional one having heat resistance, high transparency, weather resistance, electric conductivity, and decorative properties, in addition to the high gas barrier properties that preferably represent the major feature of an embodiment of the present invention, and accordingly, serves as, for example, a packaging material for foodstuffs, drug, and electronic parts and a member of electronic devices such as liquid crystal displays, organic EL displays, electronic papers, other thin-type displays, and solar batteries.

There are no specific limitations on the method to be used for forming the inorganic layer for the present invention, and useful formation methods include, for example, vacuum deposition, sputtering, ion plating, and CVD. Of these methods, sputtering is preferable as a method for forming the inorganic layer by a simple, low-cost process.

[Layer of a Phase in which Zinc Oxide, Silicon Dioxide, and Aluminum Oxide Coexist.]

Next, described in detail below is a layer of a phase in which zinc oxide, silicon dioxide, and aluminum oxide coexist that serves as a layer [B1] to be used favorably as a silicon-containing inorganic layer for an embodiment of the present invention. Hereinafter, the phase in which zinc oxide, silicon dioxide, and aluminum oxide coexist is sometimes referred to simply as $ZnO$—$SiO_2$—$Al_2O_3$. In regard to silicon dioxide ($SiO_2$), a substance having a composition ratio slightly differing from that based on the silicon-oxygen ratio in the above composition formula (between SiO and $SiO_2$) may result depending on the production conditions adopted, but such a substance is herein referred to as silicon dioxide or $SiO_2$. For zinc oxide and aluminum oxide as well, such a difference in the composition ratio from the chemical formula is treated in the same manner, and they are herein referred to as zinc oxide or ZnO, and aluminum oxide or $Al_2O_3$, respectively, regardless of the differences in their composition ratios that may occur depending on the production conditions.

In the phase in which zinc oxide, silicon dioxide, and aluminum oxide coexist, the coexistence of a crystalline component contained in the zinc oxide and an amorphous component contained in the silicon dioxide acts to depress the crystal growth of the zinc oxide, which tends to form crystallites easily, leading to the formation of particles with small diameters and, in turn, a dense layer, which would depress the penetration of oxygen and water vapor. This is considered to be the reason why the existence of the layer [B1] serves to allow the gas barrier film according to an embodiment of the present invention to have improved gas barrier properties.

It is also inferred that the coexistence of aluminum oxide acts to further prevent the crystal growth as compared with the case of the coexistence of only zinc oxide and silicon dioxide, thereby depressing the deterioration in gas barrier properties attributable to the formation of cracks.

The composition of the layer [B1] can be determined by ICP emission spectroscopy analysis as described later. The Zn atom concentration determined by ICP emission spectroscopy analysis is preferably 20 to 40 atom % for the Zn atom, 5 to 20 atom % for the Si atom, 0.5 to 5 atom % for the Al atom, and 35 to 70 atom % for the O atom. If the Zn atom concentration is more than 40 atom % or if the Si atom concentration is less than 5 atom %, there will be a lack of oxides that can depress the crystal growth of zinc oxide and the portions occupied by gaps and defects will increase, possibly making it difficult to develop gas barrier properties adequately. If the Zn atom concentration is less than 20 atom % or if the Si atom concentration is more than 20 atom %, the amorphous component of silicon dioxide in the layer will account for an increased proportion, possibly leading to a layer with decreased flexibility. If the Al atom concentration is more than 5 atom %, the affinity between zinc oxide and silicon dioxide will be so high that the film will have an increased hardness, possibly leading to the formation of cracks under heat or external stress. If the Al atom concentration is less than 0.5 atom %, the affinity between zinc oxide and silicon dioxide will not be sufficiently high, and accordingly, the binding force among the particles forming the layer will not be increased, possibly leading to decreased flexibility. If the O atom concentration is more than 70 atom %, the quantity of defects in the layer [B1] will increase, possibly leading to a failure to realize required gas barrier properties. If the O atom concentration is less than 35 atom %, zinc, silicon, and aluminum will not be in a sufficiently oxidized state, and accordingly, the crystal growth will not be depressed, leading to particles with large diameters and possibly resulting in insufficient gas barrier properties. In view of these points, the atom concentration is preferably 25 to 35 atom % for the Zn atom, 10 to 15 atom % for the Si atom, 1 to 3 atom % for the Al atom, and 50 to 64 atom % for the O atom.

There are no specific limitations on the components of the layer [B1] as long as zinc oxide, silicon dioxide, and aluminum oxide are the primary components and in the composition range specified above, and the layer may contain a metal oxide containing, for example, Al, Ti, Zr, Sn, In, Nb, Mo, Ta, and Pd. Here, the term "primary' means that the components account for 60 mass % or more, preferably 80 mass % or more, of all the components of the layer [B1].

The layer [B1] has a composition similar to that of the mixed sintered material used for producing the layer, and accordingly, the composition of the layer [B1] can be optimized by using a mixed sintered material having a composition similar to that of the intended layer.

For the composition analysis of the layer [B1], quantitative analysis of each element of zinc, silicon, and aluminum is performed by ICP emission spectroscopy, thereby determining the composition ratio of zinc oxide, silicon dioxide, aluminum oxide, and other inorganic oxides contained. Calculation for the oxygen atom is carried out on the assumption that the zinc atom, silicon atom, and aluminum atom exist in the form of zinc oxide (ZnO), silicon dioxide ($SiO_2$), and aluminum oxide ($Al_2O_3$), respectively. ICP emission spectroscopy analysis can perform simultaneous multi-element examination based on the luminescence emission spectrum observed when a specimen is introduced along with argon gas to a plasma source, and can be applied to composition analysis. If still another layer is disposed on the layer [B1], ICP luminescence spectroscopy analysis may be performed after removing the layer by ion etching or chemical treatment as required.

There are no specific limitations on the method to be used to form a layer [B1] on a polymer base, and an appropriate layer can be produced by vacuum deposition, sputtering, or ion plating of a mixed sintered material of zinc oxide, silicon dioxide, and aluminum oxide. In the case where separate materials of zinc oxide, silicon dioxide, and aluminum oxide are used, zinc oxide, silicon dioxide, and aluminum oxide are deposited or sputtered simultaneously from separate deposition sources or sputtering electrodes to produce a mixed film with an intended composition. Of these methods, sputtering using a mixed sintered material is preferably adopted for forming the layer [B1] for the present invention from the viewpoint of the gas barrier properties and the composition reproducibility for the layer to be formed.

[Layer of a Phase in which Zinc Sulfide and Silicon Dioxide Coexist.]

Next, a layer of a phase in which zinc sulfide and silicon dioxide coexist that acts as layer [B2] is described in detail below. Hereinafter, the layer of a phase in which zinc sulfide and silicon dioxide coexist is occasionally referred to ZnS—$SiO_2$. In regard to silicon dioxide ($SiO_2$), furthermore, a substance having a composition ratio slightly differing from that based on the silicon-oxygen ratio in the above composition formula will also be referred to as silicon dioxide or $SiO_2$ regardless of the difference, as in the case of the layer [B1].

In the phase in which zinc sulfide and silicon dioxide coexist, the coexistence of a crystalline component contained in the zinc sulfide and an amorphous component contained in the silicon dioxide acts to depress the crystal growth of the zinc sulfide, which tends to form crystallites easily, leading to the formation of particles with small diameters and, in turn, a dense layer, which would depress the penetration of oxygen and water vapor. This is considered to be the reason why the existence of the layer [B2] serves to allow the gas barrier film according to an embodiment of the present invention to have improved gas barrier properties. It is also considered that the coexisting zinc sulfide and silicon dioxide phase containing a zinc sulfide component with a depressed crystal growth rate is higher in flexibility than a layer composed only of an inorganic oxide or metal oxide and less liable to cracks under heat or external stress, thus allowing the layer [B2] to serve to depress the deterioration in gas barrier properties that is attributed to the formation of cracks.

In regard to the layer [B2], zinc sulfide accounts for a mole fraction of 0.7 to 0.9 of the total quantity of zinc sulfide and silicon dioxide. If zinc sulfide accounts for a mole fraction of more than 0.9 of the total quantity of zinc sulfide and silicon dioxide, there will be a lack of oxides that can depress the crystal growth of zinc sulfide and the portions occupied by gaps and defects will increase, possibly making it difficult to develop required gas barrier properties. If zinc sulfide accounts for a mole fraction of less than 0.7 of the total quantity of zinc sulfide and silicon dioxide, the quantity of the amorphous component of silicon dioxide in the layer [B2] will increase and the layer will decrease in flexibility, possibly leading to a gas barrier film with decreased flexibility under mechanical bending. It is more preferably in the range of 0.75 to 0.85.

There are no specific limitations on the components of the layer [B2] as long as zinc sulfide and silicon dioxide are the primary components and in the composition range specified above, and the layer may contain a metal oxide of, for example, Al, Ti, Zr, Sn, In, Nb, Mo, Ta, and Pd. Here, the term "primary" means that the components account for 60 mass % or more, preferably 80 mass % or more, of all the components of the layer [B2].

The layer [B2] has a composition similar to that of the mixed sintered material used for producing the layer, and accordingly, the composition of the layer [B2] can be optimized by using a mixed sintered material having a composition that meets the objective.

Composition analysis of the layer [B2] can be carried out by first determining the contents of zinc and silicon by ICP emission spectroscopy, and applying the results to quantitative analysis of each element by the Rutherford backscattering technique to determine the contents of zinc sulfide, silicon dioxide, and other inorganic oxides contained. ICP emission spectroscopy analysis can perform simultaneous multi-element examination based on the luminescence emission spectrum observed when a specimen is introduced along with argon gas to a plasma source, and can be applied to composition analysis. Furthermore, the Rutherford backscattering technique can accelerate charged particles at a high voltage, apply them to a specimen, and identify the species and determine the quantities of the elements involved from the number and energy of the charged particles rebounded from the specimen, thereby determining the content of each element. Here, since the layer [B2] is a composite layer of a sulfide and oxide, it is necessary to perform analysis by the Rutherford backscattering technique which can analyze the contents of sulfur and oxygen. If still another layer is disposed on the layer [B2], analysis by ICP luminescence spectroscopy and the Rutherford backscattering technique may be performed after removing the layer by ion etching or chemical treatment as required.

There are no specific limitations on the method to be used to form a layer [B2] on a polymer base, and an appropriate layer can be produced by vacuum deposition, sputtering, or ion plating of a mixed sintered material of zinc sulfide and silicon dioxide. In the case where separate materials of zinc sulfide and silicon dioxide are used, zinc sulfide and silicon dioxide are deposited or sputtered simultaneously from separate deposition sources or sputtering electrodes to produce a mixed film with an intended composition. Of these methods, sputtering using a mixed sintered material is preferably adopted for forming the layer [B2] for the present invention from the viewpoint of the gas barrier properties and the composition reproducibility for the layer to be formed.

Having high gas barrier properties for oxygen gas and water vapor, the gas barrier film according to the present invention can serve as a sealing member of devices such as liquid crystal displays, organic EL displays, electronic papers, and solar batteries. Applying the gas barrier film according to the present invention to devices that require higher gas barrier properties serves to provide displays, lighting apparatuses, and solar batteries with higher performance. Those displays to which the gas barrier film according to the present invention can be applied include, for example, organic EL displays and liquid crystal displays. Those lighting apparatuses to which the gas barrier film according to the present invention can be applied include, for example, organic EL lighting apparatuses. Those solar batteries to which the gas barrier film according to the present invention can be applied include, for example, thin film silicon solar batteries, thin film compound semiconductor solar batteries, and organic thin film solar batteries. Furthermore, the gas barrier film according to the present invention can also serves as packaging material for foodstuffs and drugs.

EXAMPLES

An embodiment of the invention is described specifically below with reference to Examples. It should be noted that the present invention should not be construed as limited to the Examples given below.

[Evaluation Methods]

[1] Evaluation of Acrylic Resin (1) Heating Residue (in Mass %)

The heating residue of acrylic resin was measured according to JIS K 5407 (1997) for specimens heated at 140° C. for 60 minutes. Two specimens were sampled for each test item and their average was taken as the representative value.

(2) Acid Value (in mgKOH)

The acid value of acrylic resin was measured according to JIS K 5407 (1997). Two specimens were sampled for each test item and their average was taken as the representative value.

(3) Hydroxyl Value (in mgKOH)

The hydroxyl value of a structural portion originating from an acrylic monomer of acrylic resin (simply referred to as hydroxyl value of acrylic resin) was calculated by the following formula based on the proportions of the fed materials.

Hydroxyl value of acrylic resin=proportion of 2-hydroxyethyl methacrylate in acrylic monomer (mass %)/130×561

(4) Molecular Weight

The mass average molecular weight (hereinafter referred to as Mw), number average molecular weight (hereinafter referred to as Mn), and molecular weight distribution (hereinafter referred to as d) (=Mw/Mn) of an acrylic resin was measured using a HLC-8220 GPC system manufactured by Tosoh Corporation with a TSKgel G1000HXL or G2000HXL preparative column manufactured by Tosoh Corporation. The carrier used was tetrahydrofuran (THF) and the molecular weight standard used was a polystyrene standard. A small amount of the reaction solution was sampled after the completion of polymerization and diluted with THF before measurement.

(5) Glass Transition Temperature (Tg) (° C.)

The glass transition temperature of a structural portion originating from an acrylic monomer of acrylic resin (simply referred to as glass transition temperature of acrylic resin) (Tg) (° C.) was calculated by the following formula based on the proportions of the fed materials.

Tg(° C.) of acrylic resin=1/{(proportion(mass fraction) of methacrylic acid in acrylic monomer/Tg (=403° K) of polymethacrylic acid)+(proportion (mass fraction) of 2-hydroxyethyl methacrylate in acrylic monomer/Tg(=328° K) of poly2-hydroxyethyl methacrylate)+(proportion(mass fraction) of methyl methacrylate in acrylic monomer/Tg(=378° K) of polymethyl methacrylate)+ (proportion (mass fraction) of dicyclopentanyl methacrylate in acrylic monomer/Tg(=448° K) of polydicyclopentanyl methacrylate)}−273

[2] Evaluation of Laminate Composed of Polymer Base and Undercoat Layer (6) Adhesion Between Polymer Base and Undercoat Layer A laminate structure produced by forming an undercoat layer on a polymer base is examined according to JIS K 5400 (1997) to evaluate the adhesion between the polymer base and the undercoat layer. The adhesion was ranked as good or (A) in the case where 100 squares of a total of 100 squares under test remained unremoved. It was ranked as (B) when even one square was removed.

(7) Total Light Transmittance and Haze

Light was incident on the polymer base and evaluation was carried out using a NDH2000 turbidity meter manufactured by Nippon Denshoku Industries Co., Ltd. according to JIS K 7361 (1997). For the total light transmittance evaluation, a specimen was ranked as good (A) when it was 87% or more, and (B) when it was smaller. For the haze evaluation, a specimen was ranked as good (A) when it was smaller than 1%, and (B) when it was 1% or larger.

(8) Surface Free Energy

To evaluate the surface of the undercoat layer, four measuring liquids (water, formamide, ethylene glycol, and methylene iodide) with a known surface free energy and known component forces (dispersion force, polar force, and hydrogen bonding force) were adopted to determine the contact angle of each measuring liquid on the layered film at a temperature of 23° C. and relative humidity of 65% using a CA-D contact angle gauge (manufactured by Kyowa Interface Science Co., Ltd.). Five measurements were made for each test and their average was used. The value was applied to the following formula, which is derived from the extended Fowkes' equation and Young's equation, to calculate each component force.

[Formula 2]

$$(\gamma Sd \cdot \gamma Ld)^{0.5} + (\gamma Sp \cdot \gamma Lp)^{0.5} + (\gamma Sh \cdot \gamma Lh)^{0.5} = \gamma L(1+\cos \theta)/2 \quad (1)$$

where $\gamma S = \gamma Sd + \gamma Sp + \gamma Sh$
$\gamma L = \gamma Ld + \gamma Lp + \gamma Lh$
$\gamma S$: surface energy of undercoat layer
$\gamma Sd$: dispersion force component of undercoat layer
$\gamma Sp$: polar force component of undercoat layer
$\gamma Sh$: hydrogen bonding force component of undercoat layer
$\gamma L$: surface energy of measuring liquid
$\gamma Ld$: dispersion force component
$\gamma Lp$: polar force component
$\gamma Lh$: hydrogen bonding force component
$\theta$: contact angle of measuring liquid on undercoat layer

[3] Evaluation of Gas Barrier Film (9) Adhesion Between Undercoat Layer and Inorganic Layer The adhesion was evaluated by examining the surface of the inorganic layer in a gas barrier film specimen according to JIS K 5400 (1997). The adhesion was judged to be good or ranked as (A) in the case where 100 squares of a total of 100 squares under test remained unremoved. It was ranked as (B) when even one square was removed.

(10) Water Vapor Permeability

Evaluation of gas barrier film was carried out by using a water vapor transmission rate measuring machine (Deltaperm (registered trademark)) manufactured by Technolox, U.K., under the conditions of a temperature of 40° C., humidity of 90% RH, and measuring area of 50 cm². Two specimens were sampled for each test, and five measurements were made for each specimen, followed by averaging the 10 measurements obtained to represent the water vapor transmittance.

(11) Thickness of Layer

Specimens for cross-sectional observation were prepared by the FIB technique using Microsampling System (FB-2000A, manufactured by Hitachi, Ltd.) (specifically, according to the procedure described in "Kobunshi Hyomen Kako" (Polymer Surface Processing)", Satoru Iwamori, pp. 118-119. A transmission electron microscope (H-9000UHRII, manufactured by Hitachi, Ltd.) was used at an accelerating voltage of 300 kV and the cross section of a specimen prepared for observation was examined to determine the thickness of the inorganic layer. The interfaces between the base material and inorganic layer and between the undercoat layer and inorganic layer were identified from cross-sectional observation photographs taken by transmission electron microscopy.

(12) Composition of Layer [B1]

The composition of a layer [B1] analyzed by ICP emission spectroscopy (SPS4000, manufactured by SII Nano-Technology Inc.). The contents of the zinc atom, silicon atom, and aluminum atom in a specimen were measured, and converted to the ratio in the number of atoms. Calculation for the oxygen atom was carried out on the assumption that the zinc atom, silicon atom, and aluminum atom exist in the form of zinc oxide (ZnO), silicon dioxide ($SiO_2$), and aluminum oxide ($Al_2O_3$), respectively.

(13) Surface Roughness Ra of Inorganic Layer

The surface roughness Ra of an inorganic layer was measured three times by atomic force microscopy under the following conditions, and the specimen was ranked as good or (A) when the average was 2 nm or less and (B) when it was larger.

System: NanoScopeIII/MMAFM (manufactured by Digital Instruments)
Scanner: AS-130 (J-Scanner)
Probe: NCH-W single crystal silicon (manufactured by Nanoworld)
Scanning mode: tapping mode
Scanning range: 1 μm×1 μm
Scanning speed: 0.5 Hz
Measuring environment: atmosphere with temperature of 23° C. and relative humidity of 65%

Example 1

[Production of Acrylic Resin]

First, 95.0 g of toluene, 45.0 g of methyl isobutyl ketone, and 5 g of a polymethyl methacrylate macromonomer (Macromonomer AA-6, manufactured by Toagosei Co., Ltd., number average molecular weight 6,000), which was used as macromonomer (A), were fed to a 500 mL flask equipped with a stirrer, capacitor, nitrogen gas supply nozzle, heating/cooling device, and thermometer. The temperature was raised to 85° C. while continuing the supply of nitrogen gas.

A mixture of an acrylic monomer, polymerization initiator (a), and chain transfer agent (b) prepared in advance by weighing out and mixing 1.0 g of methacrylic acid, 8.0 g of 2-hydroxyethyl methacrylate, 91.0 g of methyl methacrylate, 1.5 g of 2,2'-azobisisobutyronitrile, and 0.5 g of n-dodecyl mercaptan was supplied to the flask by constant-rate dropping continued for 3 hours.

After the completion of the dropping, polymerization was carried out for one hour, followed by adding a solution of a polymerization initiator (c) (5.0 g of toluene and 0.05 g of 2,2'-azobisisobutyronitrile). After leaving it to stand for 30 minutes, a solution of a polymerization initiator (d) (5.0 g of toluene and 0.05 g of 2,2'-azobisisobutyronitrile) was added.

After the addition, stirring was continued for one hour while maintaining a warm temperature, followed cooling to room temperature to provide a solution of acrylic resin (AA-1).

The acrylic resin AA-1 had a heating residue of 40.2 mass %, acid value of 6.5 mgKOH, hydroxyl value of 34.5 mgKOH, mass average molecular weight of 23,900, number average molecular weight of 14,500, molecular weight distribution of 1.65, and glass transition temperature of 82° C.

Details including composition, production method, and major characteristics are shown in Table 1.

TABLE 1

|  |  |  | Example 1 | Example 2 | Example 3 | Example 4 | Example 5 |
|---|---|---|---|---|---|---|---|
|  | Acrylic resin |  | $A_A$-1 | $A_A$-2 | $A_A$-3 | $A_A$-4 | $A_A$-5 |
| Organic solvent | toluene | (g) | 95.0 | 95.0 | 95.0 | 95.0 | 95.0 |
|  | ethyl acetate | (g) | 45.0 | 45.0 | 45.0 | 45.0 | 45.0 |
| Macromonomer | macromonomer (A) | (g) | 5.0 | 5.0 | 5.0 | 5.0 | 12.0 |
|  | macromonomer (Si) | (g) | 0.0 | 0.0 | 0.0 | 0.0 | 0.0 |
|  | macromonomer (F) | (g) | 0.0 | 0.0 | 0.0 | 0.0 | 0.0 |
|  | macromonomer (St) | (g) | 0.0 | 0.0 | 0.0 | 0.0 | 0.0 |
| Acrylic monomer | methacrylic acid | (g) | 1.0 | 1.0 | 1.0 | 1.0 | 1.0 |
|  | 2-hydroxyethyl methacrylate | (g) | 8.0 | 8.0 | 8.0 | 8.0 | 8.0 |
|  | methyl methacrylate | (g) | 91.0 | 0.0 | 45.5 | 91.0 | 91.0 |
|  | dicyclopentanyl methacrylate | (g) | 0.0 | 91.0 | 45.5 | 0.0 | 0.0 |
|  | total for acrylic monomers | (g) | 100.0 | 100.0 | 100.0 | 100.0 | 100.0 |
|  | Total for monomers | (g) | 105.0 | 105.0 | 105.0 | 105.0 | 112.0 |
| Polymerization initiator (a) | 2,2'-azobisisobutyronitrile | (g) | 1.5 | 1.5 | 1.5 | 1.5 | 1.7 |
| Chain transfer agent (b) | n-dodecyl mercaptan | (g) | 0.5 | 0.5 | 0.5 | 0.5 | 0.6 |
| Solution of polymerization initiator (c) | toluene | (g) | 5.0 | 5.0 | 5.0 | 5.0 | 5.6 |
|  | 2,2'-azobisisobutyronitrile | (g) | 0.05 | 0.05 | 0.05 | 0.05 | 0.06 |
| Solution of polymerization initiator (d) | toluene | (g) | 5.0 | 5.0 | 5.0 | 5.0 | 5.6 |
|  | 2,2'-azobisisobutyronitrile | (g) | 0.05 | 0.05 | 0.05 | 0.05 | 0.06 |
|  | Total | (g) | 257.1 | 257.1 | 257.1 | 257.1 | 265.6 |
| Evaluation results | heating residue | (mass %) | 40.2 | 40.2 | 40.2 | 40.2 | 40.3 |
|  | acid value | (mgKOH) | 6.5 | 6.5 | 6.5 | 6.5 | 6.5 |
|  | hydroxyl value | (mgKOH) | 34.5 | 34.5 | 34.5 | 34.5 | 34.5 |
| molecular weight | mass average molecular weight | — | 23900 | 18900 | 18900 | 23900 | 21800 |
|  | number average molecular weight | — | 14500 | 11500 | 11500 | 14500 | 12000 |
|  | molecular weight distribution | — | 1.65 | 1.64 | 1.64 | 1.65 | 1.82 |
|  | glass transition temperature | (° C.) | 82 | 141 | 109 | 82 | 56 |

|  |  |  | Example 6 | Example 7 | Example 8 | Example 9 |
|---|---|---|---|---|---|---|
|  | Acrylic resin |  | $A_A$-6 | $A_A$-7 | $A_A$-8 | $A_A$-9 |
| Organic solvent | toluene | (g) | 95.0 | 95.0 | 95.0 | 95.0 |
|  | ethyl acetate | (g) | 45.0 | 45.0 | 45.0 | 45.0 |
| Macromonomer | macromonomer (A) | (g) | 10.0 | 12.0 | 5.0 | 5.0 |
|  | macromonomer (Si) | (g) | 0.0 | 0.0 | 0.0 | 0.0 |
|  | macromonomer (F) | (g) | 0.0 | 0.0 | 0.0 | 0.0 |
|  | macromonomer (St) | (g) | 0.0 | 0.0 | 0.0 | 0.0 |
| Acrylic monomer | methacrylic acid | (g) | 0.0 | 12.0 | 1.0 | 1.0 |
|  | 2-hydroxyethyl methacrylate | (g) | 8.0 | 8.0 | 0.0 | 24.0 |
|  | methyl methacrylate | (g) | 91.0 | 91.0 | 91.0 | 91.0 |
|  | dicyclopentanyl methacrylate | (g) | 0.0 | 0.0 | 0.0 | 0.0 |
|  | total for acrylic monomers | (g) | 99.0 | 111.0 | 92.0 | 116.0 |
|  | Total for monomers | (g) | 109.0 | 123.0 | 97.0 | 121.0 |
| Polymerization initiator (a) | 2,2'-azobisisobutyronitrile | (g) | 1.6 | 1.8 | 1.5 | 1.5 |
| Chain transfer agent (b) | n-dodecyl mercaptan | (g) | 0.5 | 0.6 | 0.5 | 0.6 |
| Solution of polymerization initiator (c) | toluene | (g) | 5.5 | 6.2 | 5.0 | 5.0 |
|  | 2,2'-azobisisobutyronitrile | (g) | 0.05 | 0.06 | 0.05 | 0.06 |
| Solution of polymerization initiator (d) | toluene | (g) | 5.5 | 6.2 | 5.0 | 5.0 |
|  | 2,2'-azobisisobutyronitrile | (g) | 0.05 | 0.06 | 0.05 | 0.06 |
|  | Total | (g) | 262.2 | 277.9 | 249.1 | 273.2 |
| Evaluation results | heating residue | (mass %) | 40.3 | 40.2 | 40.1 | 40.6 |
|  | acid value | (mgKOH) | 0.0 | 78.3 | 6.5 | 6.5 |
|  | hydroxyl value | (mgKOH) | 34.5 | 34.5 | 0.0 | 103.6 |
| molecular weight | mass average molecular weight | — | 22600 | 23100 | 19600 | 22900 |
|  | number average molecular weight | — | 12300 | 12500 | 10600 | 12200 |
|  | molecular weight distribution | — | 1.84 | 1.85 | 1.85 | 1.88 |
|  | glass transition temperature | (° C.) | 66 | 29 | 118 | 28 |

[Formation of Undercoat Layer]

A mixture is produced by mixing 100 g of the acrylic resin (AA-1) solution, 19 g of a polyester diol (Flexorez XP-171-90, manufactured by King Industries, Inc.) as a modifier polymer, and xylene diisocyanate in an amount intended to adjust the NCO index to 1.0 and diluting it with 75.2 g of methyl ethyl ketone, 75.2 g of ethyl acetate, 16.6 g of cyclohexanone, 1.2 g of triethyl orthoacetate, and 1.2 g of ethanol to prepare an acrylic resin coating liquid. The polymer base used was a polyethylene terephthalate film (Lumirror (registered trademark) U48, manufactured by Toray Industries, Inc.) with a thickness of 100 μm, and one of its surfaces was coated with the acrylic resin coating liquid with a Micro Gravure coater (gravure cell count 200UR, gravure rotation ratio 100%), dried at 120° C. for two minutes, and cured at 40° C. for one week to form an undercoat layer with a thickness of 3 μm, thereby providing an undercoated laminate (a structure consisting of a polymer base coated with acrylic resin).

Table 2 shows details of a laminate (JA-1) produced by forming an undercoat layer on a polymer base.

base and an undercoat layer formed thereon, using argon gas and oxygen gas to produce an inorganic layer [B1].

Concrete operations were as described below. First, in a wind-up chamber 6 of a wind-up type sputtering apparatus 5 containing a sputtering electrode 12 carrying a sputtering target composed of zinc oxide, silicon dioxide, and aluminum oxide sintered at a mass composition ratio of 77:20:3, the laminate 4, which was composed of a polymer base and an undercoat layer formed thereon, was set on an unwinding roll 7 in such a manner that the surface to be provided with a layer [B1] faced the sputtering electrode 12 and that the film was allowed to travel on the guide rolls 8, 9, and 10 in the unwinding zone before reaching a cooling drum 11. Argon gas and oxygen gas, with an oxygen gas partial pressure of 10%, were introduced so that the degree of vacuum would be $2\times10^{-1}$ Pa, and a power of 4,000 W was applied by a direct current power source to generate argon-oxygen gas plasma, thereby producing a layer [B1] by

TABLE 2

|  |  | Example 1 | Example 2 | Example 3 | Example 4 | Example 5 | Example 6 | Example 7 | Example 8 | Example 9 |
|---|---|---|---|---|---|---|---|---|---|---|
| Layered product composed of polymer base and undercoat layer | | $J_A$-1 | $J_A$-2 | $J_A$-3 | $J_A$-4 | $J_A$-5 | $J_A$-6 | $J_A$-7 | $J_A$-8 | $J_A$-9 |
| Thickness of polyethylene terephthalate film | (μm) | 100 | 100 | 100 | 100 | 100 | 100 | 100 | 100 | 100 |
| Type of acrylic resin | | $A_A$-1 | $A_A$-2 | $A_A$-3 | $A_A$-4 | $A_A$-5 | $A_A$-6 | $A_A$-7 | $A_A$-8 | $A_A$-9 |
| Thickness of acrylic resin | (μm) | 3 | 3 | 3 | 3 | 3 | 3 | 3 | 3 | 3 |
| Evaluation results | adhesion between polymer base and undercoat layer | — | A | A | A | A | A | B | A | B | B |
| | total light transmittance | — | A | A | A | A | B | A | B | B | B |
| | haze | — | A | A | A | A | B | A | B | B | B |
| | surface free energy | (mN/m) | 42.9 | 38.8 | 40.1 | 42.9 | 41.6 | 42.0 | 43.3 | 40.5 | 46.3 |

[Production of Inorganic Layer (layer [B1])]

Figure 2:
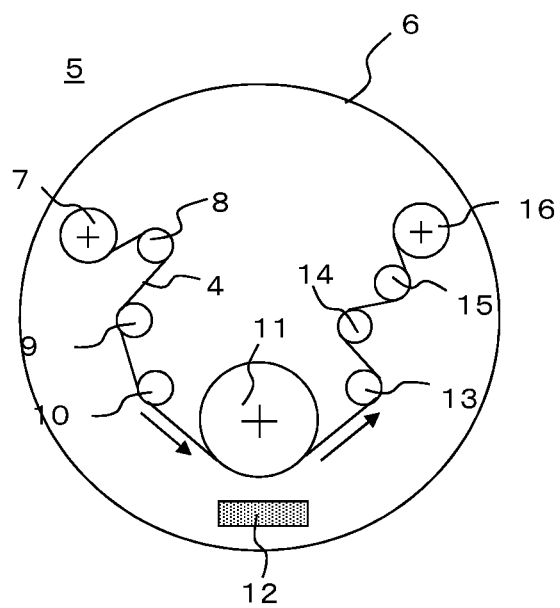
FIG. 2 is a schematic cross-sectional diagram of a wind-up type sputtering apparatus designed for the production of the gas barrier film according to an embodiment of the present invention.

A wind-up type sputtering apparatus having a structure as illustrating FIG. 2 was set up, and a sputtering target, that is, a mixed sintered material formed of zinc oxide, silicon dioxide, and aluminum oxide, was installed on a sputtering electrode 12 and sputtered on the surface of the undercoat layer of the laminate 4, which was composed of a polymer sputtering on the surface of the laminate 4, which was composed of a polymer base and an undercoat layer formed thereon. The thickness was adjusted by controlling the film conveyance speed. Subsequently, the film was wound up on a wind-up roll 16 after travelling on guide rolls 13, 14, and 15 in the winding-up zone, thereby providing a gas barrier film ($F_A$-1).

Table 3 shows details of the gas barrier film.

TABLE 3

|  |  | Example 1 | Example 2 | Example 3 | Example 4 | Example 5 | Example 6 | Example 7 | Example 8 | Example 9 |
|---|---|---|---|---|---|---|---|---|---|---|
| Gas barrier properties film | | $F_A$-1 | $F_A$-2 | $F_A$-3 | $F_A$-4 | $F_A$-5 | $F_A$-6 | $F_A$-7 | $F_A$-8 | $F_A$-9 |
| Layered product composed of polymer base and undercoat layer | | $J_A$-1 | $J_A$-2 | $J_A$-3 | $J_A$-4 | $J_A$-5 | $J_A$-6 | $J_A$-7 | $J_A$-8 | $J_A$-9 |
| Type of inorganic layer | — | [B1] | [B1] | [B1] | [B2] | [B1] | [B1] | [B1] | [B1] | [B1] |
| Thickness of inorganic layer | (nm) | 100 | 100 | 100 | 100 | 100 | 100 | 100 | 100 | 100 |
| Surface roughness Ra of inorganic layer | — | A | A | A | A | B | B | B | B | B |
| Evaluation results | adhesion between undercoat layer and inorganic layer | — | A | A | A | A | A | A | A | A | A |
| | water vapor transmittance | (g/m²/day) | $7.2 \times 10^{-3}$ | $5.7 \times 10^{-3}$ | $5.9 \times 10^{-3}$ | $9.5 \times 10^{-3}$ | $6.3 \times 10^{-2}$ | $6.8 \times 10^{-2}$ | $6.1 \times 10^{-2}$ | $7.7 \times 10^{-2}$ | $8.2 \times 10^{-2}$ |

Table 4 shows results of composition analysis of the layer [B1] obtained in Example 1.

TABLE 4

| | Inorganic layer | Proportion in number of atoms (atom %) | | | |
|---|---|---|---|---|---|
| | | Zn | Si | Al | O |
| Example 1 | [B1] layer | 27.5 | 13.1 | 2.3 | 57.1 |

Examples 2 to 9

Except for using each of the compositions given in Table 1, the same procedure as in Example 1 was carried out to prepare an acrylic resin ($A_A$-2 to $A_A$-9), form an undercoat layer on a polymer base (laminates $J_A$-2 to $J_A$-9 composed of a polymer base and an undercoat layer), and form an inorganic layer on the undercoat layer, thereby producing a gas barrier film ($F_A$-2 to $F_A$-9). The inorganic layer formed was a layer [B1] except in Example 4, and a layer [B2] was formed in Example 4 by the following procedure instead of forming a layer [B1].

(Formation of Layer [B2])

A wind-up type sputtering apparatus having a structure as illustrating FIG. 2 was set up, and a sputtering target, that is, a mixed sintered material formed of zinc sulfide and silicon dioxide was installed on a sputtering electrode 12 and sputtered on the surface of the undercoat layer of the undercoated laminate 4 using argon gas plasma to produce a layer [B2].

Concrete operations were as described below. First, in a wind-up chamber 6 of a wind-up type sputtering apparatus 5 containing a sputtering electrode 12 carrying a sputtering target composed of zinc sulfide and silicon dioxide sintered at a molar composition ratio of 80:20, the laminate 4, which was composed of a polymer base and an undercoat layer formed thereon, was set on an unwinding roll 7 in such a manner that the film would travel on the guide rolls 8, 9, and 10 in the unwinding zone before reaching a cooling drum 11. Argon gas was introduced so that the degree of vacuum would be $2 \times 10^{-1}$ Pa, and a power of 500 W was applied by a high frequency power source to generate argon gas plasma, thereby producing a layer [B2] by sputtering on the surface of the laminate 4, which was composed of a polymer base and an undercoat layer formed thereon. The thickness was adjusted by controlling the film conveyance speed. Subsequently, the film was wound up on a wind-up roll 16 after travelling on guide rolls 13, 14, and 15 in the winding-up zone, thereby providing a gas barrier film ($F_A$-4).

Examples 11 to 20

Except for using each of the compositions given in Table 5, the same procedure as in Example 1 was carried out to produce an acrylic resin ($A_{Si}$-1 to $A_{Si}$-4, $A_F$-5, $A_{Si}$-6 to 9, and $A_{Si-F}$-10). Here, the macromonomer used in Examples 11 to 14 and Examples 16 to 19 was a macromonomer (Si) (Macromonomer AK-32, manufactured by Toagosei Co., Ltd., number average molecular weight 6,000), and the macromonomer (F) used in Example 15 was synthesized from V-8FM (manufactured by Osaka Organic Chemical Industry Ltd. industry, number average molecular weight 6,000) employed as input material according to the method described in Japanese Unexamined Patent Publication (Kokai) No. HEI-10-120738. For Example 20, furthermore, a resin was synthesized according to the method described in Japanese Unexamined Patent Publication (Kokai) No. HEI-10-120738 from the macromonomer (Si) and the macromonomer (F) mixed at a compounding ratio given Table 5. Details including composition, production method, and major characteristics are shown in Table 5.

TABLE 5

| | | | | Example 11 | Example 12 | Example 13 | Example 14 | Example 15 |
|---|---|---|---|---|---|---|---|---|
| | | Acrylic resin | | Asi-1 | Asi-2 | Asi-3 | Asi-4 | $A_F$-5 |
| Organic | | toluene | (g) | 95.0 | 95.0 | 95.0 | 95.0 | 95.0 |
| solvent | | ethyl acetate | (g) | 45.0 | 45.0 | 45.0 | 45.0 | 45.0 |
| Macromonomer | | macromonomer (A) | (g) | 0.0 | 0.0 | 0.0 | 0.0 | 0.0 |
| | | macromonomer (Si) | (g) | 5.0 | 5.0 | 5.0 | 5.0 | 0.0 |
| | | macromonomer (F) | (g) | 0.0 | 0.0 | 0.0 | 0.0 | 5.0 |
| | | macromonomer (St) | (g) | 0.0 | 0.0 | 0.0 | 0.0 | 0.0 |
| Acrylic | | methacrylic acid | (g) | 1.0 | 1.0 | 1.0 | 1.0 | 1.0 |
| monomer | | 2-hydroxyethyl methacrylate | (g) | 8.0 | 8.0 | 8.0 | 8.0 | 8.0 |
| | | methyl methacrylate | (g) | 91.0 | 0.0 | 45.5 | 91.0 | 91.0 |
| | | dicyclopentanyl methacrylate | (g) | 0.0 | 91.0 | 45.5 | 0.0 | 0.0 |
| | | total for acrylic monomers | (g) | 100.0 | 100.0 | 100.0 | 100.0 | 100.0 |
| | | Total for monomers | (g) | 105.0 | 105.0 | 105.0 | 105.0 | 105.0 |
| Polymerization initiator (a) | | 2,2'-azobisisobutyronitrile | (g) | 1.5 | 1.5 | 1.5 | 1.5 | 1.5 |
| Chain transfer agent (b) | | n-dodecyl mercaptan | (g) | 0.5 | 0.5 | 0.5 | 0.5 | 0.5 |
| Solution of polymerization initiator (c) | | toluene | (g) | 5.0 | 0.0 | 1.0 | 2.0 | 3.0 |
| | | 2,2'-azobisisobutyronitrile | (g) | 0.05 | 0.05 | 0.05 | 0.05 | 0.05 |
| Solution of polymerization initiator (d) | | toluene | (g) | 5.0 | 5.0 | 5.0 | 5.0 | 5.0 |
| | | 2,2'-azobisisobutyronitrile | (g) | 0.05 | 0.05 | 0.05 | 0.05 | 0.05 |
| | Total | | (g) | 257.1 | 252.1 | 253.1 | 254.1 | 255.1 |

TABLE 5-continued

| Evaluation results | heating residue | (mass %) | 40.0 | 40.0 | 40.0 | 40.0 | 40.0 |
|---|---|---|---|---|---|---|---|
| | acid value | (mgKOH) | 6.5 | 6.5 | 6.5 | 6.5 | 6.5 |
| | hydroxyl value | (mgKOH) | 34.5 | 34.5 | 34.5 | 34.5 | 34.5 |
| | molecular weight | mass average molecular weight | — | 24400 | 18900 | 18900 | 24400 | 22400 |
| | | number average molecular weight | — | 15800 | 11500 | 11500 | 16500 | 14700 |
| | | molecular weight distribution | — | 1.54 | 1.64 | 1.64 | 1.48 | 1.52 |
| | glass transition temperature | (° C.) | 101 | 162 | 129 | 101 | 101 |

| | | | Example 16 | Example 17 | Example 18 | Example 19 | Example 20 |
|---|---|---|---|---|---|---|---|
| | Acrylic resin | | Asi-6 | Asi-7 | Asi-8 | Asi-9 | $A_{si-F}$-10 |
| Organic solvent | toluene | (g) | 95.0 | 95.0 | 95.0 | 95.0 | 95.0 |
| | ethyl acetate | (g) | 45.0 | 45.0 | 45.0 | 45.0 | 45.0 |
| Macromonomer | macromonomer (A) | (g) | 0.0 | 0.0 | 0.0 | 0.0 | 0.0 |
| | macromonomer (Si) | (g) | 12.0 | 5.0 | 5.0 | 5.0 | 2.5 |
| | macromonomer (F) | (g) | 0.0 | 0.0 | 0.0 | 0.0 | 2.5 |
| | macromonomer (St) | (g) | 0.0 | 0.0 | 0.0 | 0.0 | 0.0 |
| Acrylic monomer | methacrylic acid | (g) | 1.0 | 12.0 | 1.0 | 1.0 | 1.0 |
| | 2-hydroxyethyl methacrylate | (g) | 8.0 | 8.0 | 0.0 | 24.0 | 8.0 |
| | methyl methacrylate | (g) | 91.0 | 91.0 | 91.0 | 91.0 | 91.0 |
| | dicyclopentanyl methacrylate | (g) | 0.0 | 0.0 | 0.0 | 0.0 | 0.0 |
| | total for acrylic monomers | (g) | 100.0 | 111.0 | 92.0 | 116.0 | 100.0 |
| | Total for monomers | (g) | 112.0 | 116.0 | 97.0 | 121.0 | 105.0 |
| Polymerization initiator (a) | 2,2'-azobisisobutyronitrile | (g) | 1.7 | 1.7 | 1.5 | 1.5 | 1.5 |
| Chain transfer agent (b) | n-dodecyl mercaptan | (g) | 0.6 | 0.6 | 0.5 | 0.6 | 0.5 |
| Solution of polymerization initiator (c) | toluene | (g) | 5.6 | 5.8 | 5.0 | 5.0 | 5.0 |
| | 2,2'-azobisisobutyronitrile | (g) | 0.06 | 0.06 | 0.05 | 0.06 | 0.05 |
| Solution of polymerization initiator (d) | toluene | (g) | 5.6 | 5.8 | 5.0 | 5.0 | 5.0 |
| | 2,2'-azobisisobutyronitrile | (g) | 0.06 | 0.06 | 0.05 | 0.06 | 0.05 |
| | Total | (g) | 265.6 | 270.0 | 249.1 | 273.2 | 257.1 |
| Evaluation results | heating residue | (mass %) | 40.0 | 40.0 | 40.0 | 40.0 | 40.0 |
| | acid value | (mgKOH) | 6.5 | 78.3 | 6.5 | 6.5 | 6.5 |
| | hydroxyl value | (mgKOH) | 34.5 | 34.5 | 0.0 | 103.6 | 34.5 |
| | molecular weight | mass average molecular weight | — | 21800 | 23100 | 19600 | 22900 | 24900 |
| | | number average molecular weight | — | 12000 | 12500 | 10600 | 12200 | 16300 |
| | | molecular weight distribution | — | 1.82 | 1.85 | 1.85 | 1.88 | 1.52 |
| | glass transition temperature | (° C.) | 101 | 70 | 139 | 43 | 101 |

Subsequently, laminates ($J_{Si}$-1 to 4, $J_F$-5, $J_{Si}$-6 to 9, and $J_{Si-F}$-10), each composed of a polymer base and an undercoat layer formed thereon, were produced. Details are given in Table 6.

TABLE 6

| | | Example 11 | Example 12 | Example 13 | Example 14 | Example 15 |
|---|---|---|---|---|---|---|
| Layered product composed of polymer base and undercoat layer | | $J_{Si}$1 | $J_{Si}$2 | $J_{Si}$3 | $J_{Si}$4 | $J_F$5 |
| Polyethylene terephthalate film with a thickness of | (μm) | 100 | 100 | 100 | 100 | 100 |
| Type of acrylic resin | | Asi-1 | Asi-2 | Asi-3 | Asi-4 | $A_F$-5 |
| Thickness of acrylic resin | (μm) | 3 | 3 | 3 | 3 | 3 |
| Evaluation results | adhesion between polymer base and undercoat layer | — | A | A | A | A | A |
| | total light transmittance | — | A | A | A | A | A |
| | haze | — | A | A | A | A | A |
| | surface free energy | (mN/m) | 20.1 | 15.9 | 19.2 | 20.1 | 23.2 |

TABLE 6-continued

|  |  | Example 16 | Example 17 | Example 18 | Example 19 | Example 20 |
|---|---|---|---|---|---|---|
| Layered product composed of polymer base and undercoat layer | | $J_{Si}$-6 | $J_{Si}$-7 | $J_{Si}$-8 | $J_{Si}$-9 | $J_{Si-F}$-10 |
| Polyethylene terephthalate film with a thickness of | (μm) | 100 | 100 | 100 | 100 | 100 |
| Type of acrylic resin | | Asi-6 | Asi-7 | Asi-8 | Asi-9 | $A_{si-F}$-10 |
| Thickness of acrylic resin | (μm) | 3 | 3 | 3 | 3 | 3 |
| Evaluation results | adhesion between polymer base and undercoat layer | — | A | A | B | B | A |
| | total light transmittance | — | B | B | B | B | A |
| | haze | — | B | B | B | B | A |
| | surface free energy | (mN/m) | 13.2 | 17.7 | 16.5 | 24.0 | 22.2 |

Then, an inorganic layer [B1] was formed by sputtering on the surface of the undercoat layer of the laminate 4, which was composed of a polymer base and an undercoat layer formed thereon, according to the same procedure as in Example 1 to provide a gas barrier film ($F_{Si}$-1 to $F_{Si}$-3, $F_F$-5, $F_{Si}$-6 to 9, and $F_{Si-F}$-10). In Example 14, the same procedure as in Example 4 was carried to form a layer [B2], instead of forming a layer [B1], to provide a gas barrier film ($F_{Si}$-4).

Table 7 shows details of the gas barrier film.

TABLE 7

|  |  | Example 11 | Example 12 | Example 13 | Example 14 | Example 15 |
|---|---|---|---|---|---|---|
| Gas barrier properties film | | $F_{Si}$-1 | $F_{Si}$-2 | $F_{Si}$-3 | $F_{Si}$-4 | $F_F$-5 |
| Layered product composed of polymer base and undercoat layer | | $J_{Si}$-1 | $J_{Si}$-2 | $J_{Si}$-3 | $J_{Si}$-4 | $J_F$-5 |
| Type of inorganic layer | — | [B1] | [B1] | [B1] | [B2] | [B1] |
| Thickness of inorganic layer | (nm) | 100 | 100 | 100 | 100 | 100 |
| Surface roughness Ra of inorganic layer | — | A | A | A | A | A |
| Evaluation results | adhesion between undercoat layer and inorganic layer | — | A | A | A | A | A |
| | water vapor transmittance | (g/m²/day) | $4.1 \times 10^{-3}$ | $7.2 \times 10^{-3}$ | $5.5 \times 10^{-3}$ | $7.6 \times 10^{-3}$ | $6.2 \times 10^{-3}$ |

|  |  | Example 16 | Example 17 | Example 18 | Example 19 | Example 20 |
|---|---|---|---|---|---|---|
| Gas barrier properties film | | $F_{Si}$-6 | $F_{Si}$-7 | $F_{Si}$-8 | $F_{Si}$-9 | $F_{Si-F}$-10 |
| Layered product composed of polymer base and undercoat layer | | $J_{Si}$-6 | $J_{Si}$-7 | $J_{Si}$-8 | $J_{Si}$-9 | $J_{Si-F}$-10 |
| Type of inorganic layer | — | [B1] | [B1] | [B1] | [B1] | [B1] |
| Thickness of inorganic layer | (nm) | 100 | 100 | 100 | 100 | 100 |
| Surface roughness Ra of inorganic layer | — | B | B | B | B | A |
| Evaluation results | adhesion between undercoat layer and inorganic layer | — | B | A | A | A | A |
| | water vapor transmittance | (g/m²/day) | $2.8 \times 10^{-2}$ | $4.4 \times 10^{-2}$ | $3.8 \times 10^{-2}$ | $6.5 \times 10^{-2}$ | $6.8 \times 10^{-3}$ |

In addition, Table 8 shows results of composition analysis of the layer [B1] obtained in Example 11.

TABLE 8

|  |  | Proportion in number of atoms (atom %) | | | |
|---|---|---|---|---|---|
|  | Inorganic layer | Zn | Si | Al | O |
| Example 11 | [B1] layer | 26.5 | 14.4 | 2.1 | 57.0 |

Examples 21 to 26

Except for using each of the compositions given in Table 9, the same procedure as in Example 1 was carried out to produce an acrylic resin ($A_{A-Si}$-1 to $A_{A-Si}$-3, $A_{A-F}$-4, $A_{A-Si-F}$-5, and $A_{A-Si}$-6). Here, the macromonomer (F) used in Examples 24 and 25 was synthesized from V-8FM (manufactured by Osaka Organic Chemical Industry Ltd. industry, number average molecular weight 6,000) employed as input material according to the method described in Japanese Unexamined Patent Publication (Kokai) No. HEI-10-120738. Details including composition, production method, and major characteristics are shown in Table 9.

TABLE 9

|  |  |  | Example 21 | Example 22 | Example 23 | Example 24 | Example 25 | Example 26 |
|---|---|---|---|---|---|---|---|---|
|  | Acrylic resin |  | $A_{A\text{-}Si}$-1 | $A_{A\text{-}Si}$-2 | $A_{A\text{-}Si}$-3 | $A_{A\text{-}F}$-4 | $A_{A\text{-}Si\text{—}F}$-5 | $A_{A\text{-}Si}$-6 |
| Organic | toluene | (g) | 95.0 | 95.0 | 95.0 | 95.0 | 95.0 | 95.0 |
| solvent | ethyl acetate | (g) | 45.0 | 45.0 | 45.0 | 45.0 | 45.0 | 45.0 |
| Macromonomer | macromonomer (A) | (g) | 2.0 | 2.0 | 2.0 | 2.0 | 1.0 | 2.0 |
|  | macromonomer (Si) | (g) | 3.0 | 3.0 | 3.0 | 0.0 | 2.0 | 3.0 |
|  | macromonomer (F) | (g) | 0.0 | 0.0 | 0.0 | 3.0 | 2.0 | 0.0 |
|  | macromonomer (St) | (g) | 0.0 | 0.0 | 0.0 | 0.0 | 0.0 | 0.0 |
| Acrylic | methacrylic acid | (g) | 1.0 | 1.0 | 1.0 | 1.0 | 1.0 | 1.0 |
| monomer | 2-hydroxyethyl methacrylate | (g) | 8.0 | 8.0 | 8.0 | 8.0 | 8.0 | 8.0 |
|  | methyl methacrylate | (g) | 91.0 | 0.0 | 45.5 | 91.0 | 91.0 | 91.0 |
|  | dicyclopentanyl methacrylate | (g) | 0.0 | 91.0 | 45.5 | 0.0 | 0.0 | 0.0 |
|  | total for acrylic monomers | (g) | 100.0 | 100.0 | 100.0 | 100.0 | 100.0 | 100.0 |
|  | Total for monomers | (g) | 105.0 | 105.0 | 105.0 | 105.0 | 105.0 | 105.0 |
| Polymerization initiator (a) | 2,2'-azobisisobutyronitrile | (g) | 1.5 | 1.5 | 1.5 | 1.5 | 1.5 | 2.5 |
| Chain transfer agent (b) | n-dodecyl mercaptan | (g) | 0.5 | 0.5 | 0.5 | 0.5 | 0.5 | 0.5 |
| Solution of polymerization initiator (c) | toluene | (g) | 5.0 | 0.0 | 1.0 | 2.0 | 3.0 | 4.0 |
|  | 2,2'-azobisisobutyronitrile | (g) | 0.05 | 0.05 | 0.05 | 0.05 | 0.05 | 0.05 |
| Solution of polymerization initiator (d) | toluene | (g) | 5.0 | 5.0 | 5.0 | 5.0 | 5.0 | 6.0 |
|  | 2,2'-azobisisobutyronitrile | (g) | 0.05 | 0.05 | 0.05 | 0.05 | 0.05 | 0.05 |
|  | Total | (g) | 257.1 | 252.1 | 253.1 | 254.1 | 255.1 | 258.1 |
| Evaluation | heating residue | (mass %) | 40.0 | 40.0 | 40.0 | 40.0 | 40.0 | 41.0 |
| results | acid value | (mgKOH) | 6.5 | 6.5 | 6.5 | 6.5 | 6.5 | 6.5 |
|  | hydroxyl value | (mgKOH) | 34.5 | 34.5 | 34.5 | 34.5 | 34.5 | 34.5 |
| molecular weight | mass average molecular weight | — | 23100 | 19100 | 20300 | 22100 | 24000 | 23100 |
|  | number average molecular weight | — | 14700 | 11900 | 12900 | 14000 | 15400 | 14700 |
|  | molecular weight distribution | — | 1.57 | 1.61 | 1.57 | 1.58 | 1.56 | 1.57 |
|  | glass transition temperature | (° C.) | 101 | 162 | 129 | 101 | 101 | 101 |

Subsequently, laminates ($J_{A\text{-}Si}$-1 to 3, $J_{A\text{-}F}$-4, $J_{A\text{-}Si\text{—}F}$-5, and $J_{A\text{-}Si}$-6), each composed of a polymer base and an undercoat layer formed thereon, were produced. Details are given in Table 10.

TABLE 10

|  |  | Example 21 | Example 22 | Example 23 | Example 24 | Example 25 | Example 26 |
|---|---|---|---|---|---|---|---|
| Layered product composed of polymer base and undercoat layer |  | $J_{A\text{-}Si}$-1 | $J_{A\text{-}Si}$-2 | $J_{A\text{-}Si}$-3 | $J_{A\text{-}F}$-4 | $J_{A\text{-}Si\text{—}F}$-5 | $J_{A\text{-}Si}$-6 |
| Thickness of polyethylene terephthalate film | (μm) | 100 | 100 | 100 | 100 | 100 | 100 |
| Type of acrylic resin |  | $A_{A\text{-}Si}$-1 | $A_{A\text{-}Si}$-2 | $A_{A\text{-}Si}$-3 | $A_{A\text{-}F}$-4 | $A_{A\text{-}Si\text{—}F}$-5 | $A_{A\text{-}Si}$-6 |
| Thickness of acrylic resin | (μm) | 3 | 3 | 3 | 3 | 3 | 3 |
| Evaluation results | adhesion between polymer base and undercoat layer | — | A | A | A | A | A | A |
|  | total light transmittance | — | A | A | A | A | A | A |
|  | haze | — | A | A | A | A | A | A |
|  | surface free energy | (mN/m) | 20.1 | 15.9 | 19.2 | 20.1 | 23.2 | 20.1 |

Then, an inorganic layer [B1] was formed by sputtering on the surface of the undercoat layer of the laminate 4, which was composed of a polymer base and an undercoat layer formed thereon, according to the same procedure as in Example 1 to provide a gas barrier film ($F_{A\text{-}Si}$-1 to $F_{A\text{-}Si}$-3, $F_{A\text{-}F}$-4, and $F_{A\text{-}Si\text{—}F}$-5). In Example 26, the same procedure as in Example 4 was carried to form a layer [B2], instead of forming a layer [B1], to provide a gas barrier film ($F_{A\text{-}Si}$-6).

Table 11 shows details of the gas barrier film.

TABLE 11

|  |  | Example 21 | Example 22 | Example 23 | Example 24 | Example 25 | Example 26 |
|---|---|---|---|---|---|---|---|
| Gas barrier properties film |  | $F_{A\text{-}Si}$-1 | $F_{A\text{-}Si}$-2 | $F_{A\text{-}Si}$-3 | $F_{A\text{-}F}$-4 | $F_{A\text{-}Si\text{—}F}$-5 | $F_{A\text{-}Si}$-6 |
| Layered product composed of polymer base and undercoat layer |  | $J_{A\text{-}Si}$-1 | $J_{A\text{-}Si}$-2 | $J_{A\text{-}Si}$-3 | $J_{A\text{-}F}$-4 | $J_{A\text{-}Si\text{—}F}$-5 | $J_{A\text{-}Si}$-6 |
| Type of inorganic layer | — | [B1] | [B1] | [B1] | [B1] | [B1] | [B2] |
| Thickness of inorganic layer | (nm) | 100 | 100 | 100 | 100 | 100 | 101 |

TABLE 11-continued

|  |  | Example 21 | Example 22 | Example 23 | Example 24 | Example 25 | Example 26 |
|---|---|---|---|---|---|---|---|
| Evaluation results | Surface roughness Ra of inorganic layer | — | A | A | A | A | A | A |
|  | adhesion between undercoat layer and inorganic layer | — | A | A | A | A | A | A |
|  | water vapor transmittance (g/m²/day) | $3.3 \times 10^{-3}$ | $6.7 \times 10^{-3}$ | $5.0 \times 10^{-3}$ | $9.6 \times 10^{-3}$ | $8.8 \times 10^{-3}$ | $7.3 \times 10^{-3}$ |

Table 12 shows results of composition analysis of the layer [B1] obtained in Example 21.

TABLE 12

|  | Inorganic layer | Proportion in number of atoms (atom %) | | | |
|---|---|---|---|---|---|
|  |  | Zn | Si | Al | O |
| Example 21 | [B1] layer | 27.1 | 13.5 | 2.6 | 56.8 |

Comparative Examples 1 to 3

Except for using each of the compositions given in Table 13, the same procedure as in Example 1 was carried out to produce an acrylic resin (a-1, $a_{St}$-2, and $a_A$-3). The macromonomer used in Comparative example 2, however, was a macromonomer (St) (Macromonomer AS-6, manufactured by Toagosei Co., Ltd., number average molecular weight 6,000). Details including composition, production method, and major characteristics are shown in Table 13.

TABLE 13

|  |  |  | Comparative example 1 | Comparative example 2 | Comparative example 3 |
|---|---|---|---|---|---|
| Acrylic resin |  |  | a-1 | $a_{St}$-2 | $a_A$-3 |
| Organic solvent | toluene | (g) | 95.0 | 95.0 | 95.0 |
|  | ethyl acetate | (g) | 45.0 | 45.0 | 45.0 |
| Macromonomer | macromonomer (A) | (g) | 0.0 | 0.0 | 5.0 |
|  | macromonomer (Si) | (g) | 0.0 | 0.0 | 0.0 |
|  | macromonomer (F) | (g) | 0.0 | 0.0 | 0.0 |
|  | macromonomer (St) | (g) | 0.0 | 5.0 | 0.0 |
| Acrylic monomer | methacrylic acid | (g) | 1.0 | 1.0 | 1.0 |
|  | 2-hydroxyethyl methacrylate | (g) | 8.0 | 8.0 | 8.0 |
|  | methyl methacrylate | (g) | 91.0 | 91.0 | 91.0 |
|  | dicyclopentanyl methacrylate | (g) | 0.0 | 0.0 | 0.0 |
|  | total for acrylic monomers | (g) | 100.0 | 100.0 | 100.0 |
|  | Total for monomers | (g) | 100.0 | 100.0 | 105.0 |
| Polymerization initiator (a) | 2,2'-azobisisobutyronitrile | (g) | 1.5 | 1.5 | 1.5 |
| Chain transfer agent (b) | n-dodecyl mercaptan | (g) | 0.5 | 0.5 | 0.5 |
| Solution of polymerization initiator (c) | toluene | (g) | 5.0 | 5.0 | 5.0 |
|  | 2,2'-azobisisobutyronitrile | (g) | 0.05 | 0.05 | 0.05 |
| Solution of polymerization initiator (d) | toluene | (g) | 5.0 | 5.0 | 5.0 |
|  | 2,2'-azobisisobutyronitrile | (g) | 0.05 | 0.05 | 0.05 |
|  | Total | (g) | 252.1 | 252.1 | 257.1 |
| Evaluation results | heating residue | (mass %) | 40.0 | 40.0 | 40.2 |
|  | acid value | (mgKOH) | 6.5 | 6.5 | 6.5 |
|  | hydroxyl value | (mgKOH) | 34.5 | 34.5 | 34.5 |
| molecular weight | mass average molecular weight | — | 20500 | 24300 | 23900 |
|  | number average molecular weight | — | 12100 | 13700 | 14500 |
|  | molecular weight distribution | — | 1.69 | 1.77 | 1.65 |
|  | glass transition temperature | (° C.) | 101 | 101 | 82 |

Subsequently, laminates (j-1, $j_{Sr}$-2, and $j_A$-3), each composed of a polymer base and an undercoat layer formed thereon, were produced. Details are given in Table 14.

TABLE 14

|  |  | Comparative example 1 | Comparative example 2 | Comparative example 3 |
|---|---|---|---|---|
| Layered product composed of polymer base and undercoat layer |  | j-1 | $j_{Sr}$-2 | $j_A$-3 |
| Thickness of polyethylene terephthalate film | (μm) | 100 | 100 | 100 |
| Type of acrylic resin |  | a-1 | $a_{Sr}$-2 | $a_A$-1 |
| Thickness of acrylic resin | (μm) | 3 | 3 | 3 |
| Evaluation results | adhesion between polymer base and undercoat layer | — | A | A | A |
|  | total light transmittance | — | A | A | A |
|  | haze | — | A | A | A |
|  | surface free energy | (mN/m) | 43.1 | 39.0 | 42.9 |

Then, an inorganic layer [B1] was formed by sputtering on the surface of the undercoat layer of the laminate 4, which was composed of a polymer base and an undercoat layer formed thereon, to provide a gas barrier film (f-1 and $f_{Sr}$-2).

In Comparative example 3, the laminate 4, which was composed of a polymer base and an undercoat layer formed thereon, was coated with a macromonomer-free ultraviolet-cured clear hard coat, namely, Pholucid No. 300C (manufactured by Chugoku Marine Paints, Ltd.), with an intended dry thickness of 3 μm using a Micro Gravure coater (gravure cell count 200UR, and gravure rotate ratio 100%), dried at 80° C. for 30 seconds and cured by exposure to ultraviolet ray of 300 mJ/cm$^2$, followed by forming an inorganic layer [B1] to provide a gas barrier film ($f_A$-3). Table 15 shows details of the gas barrier film.

TABLE 15

|  |  | Comparative example 1 | Comparative example 2 | Comparative example 3 |
|---|---|---|---|---|
| Gas barrier properties film |  | f-1 | $f_{Sr}$-2 | $f_A$-3 |
| Layered product composed of polymer base and undercoat layer |  | j-1 | $j_{Sr}$-2 | $j_A$-3 |
| Type of inorganic layer |  | [B1] | [B1] | [B1] |
| Thickness of inorganic layer | (nm) | 100 | 100 | 100 |
| Surface roughness Ra of inorganic layer |  | B | B | A |
| Evaluation results | adhesion between undercoat layer and inorganic layer | — | A | A | A |

TABLE 15-continued

|  |  | Comparative example 1 | Comparative example 2 | Comparative example 3 |
|---|---|---|---|---|
| water vapor transmittance | (g/m$^2$/day) | $1.3 \times 10^{-1}$ | $9.2 \times 10^{-2}$ | $5.3 \times 10^{-1}$ |

EXPLANATION OF NUMERALS 1. polymer base
2. undercoat layer
3. inorganic layer
4. laminate composed of a polymer base and an undercoat layer formed thereon
5. wind-up type sputtering apparatus
6. wind-up chamber
7. unwinding roll
8, 9, and 10. guide roll in unwinding zone
11. cooling drum
12. sputtering electrode
13, 14, and 15. guide roll in wind-up zone
16. wind-up roll

What is claimed:

1. A gas barrier film comprising a polymer base laminated, at least on one surface thereof, with an inorganic layer, wherein the inorganic layer comprises a layer [B1] as specified below:
    Layer [B1]: a layer of a phase in which zinc oxide, silicon dioxide, and aluminum oxide coexist, wherein the inorganic layer is a layer [B1] as specified above and the layer [B1] has
    a zinc (Zn) atom concentration of 20 to 40 atom %,
    a silicon (Si) atom concentration of 13.1 to 20 atom %,
    an aluminum (Al) atom concentration of 0.5 to 5 atom %, and
    an oxygen (O) atom concentration of 35 to 70 atom % as determined by ICP emission spectroscopy analysis.

2. Gas barrier film as described in claim 1, wherein the inorganic layer has a thickness of 10 to 1,000 nm.

3. Gas barrier film as described in claim 1, wherein the inorganic layer has a surface roughness Ra of 2 nm or less.

4. Gas barrier film as described in claim 1, further comprising an undercoat layer, wherein the undercoat layer and the inorganic layer are stacked in contact with each other in this order on the polymer base.

5. Gas barrier film as described in claim 4, wherein the undercoat layer contains an acrylic resin as the primary component.

6. Gas barrier film as described in claim 4, wherein the undercoat layer has a surface free energy of 10 to 45 mN/m.

7. Gas barrier film as described in claim 4, wherein the undercoat layer has a thickness of 0.2 to 10 μm.

* * * * *